(12) United States Patent
Wang et al.

(10) Patent No.: US 12,740,184 B2
(45) **Date of Patent: *Sep. 15, 2026**

(54) SOLAR CELL, METHOD FOR PREPARING THE SAME, AND PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Zhao Wang, Haining (CN); Jie Mao, Haining (CN); Jingming Zheng, Haining (CN); Xinyu Zhang, Haining (CN); Peiting Zheng, Haining (CN); Jie Yang, Haining (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/212,646

(22) Filed: May 19, 2025

(65) Prior Publication Data

US 2025/0287725 A1 Sep. 11, 2025

Related U.S. Application Data

(63) Continuation of application No. 18/593,812, filed on Mar. 1, 2024, now Pat. No. 12,342,657.

(30) Foreign Application Priority Data

Dec. 15, 2023 (CN) ......................... 202311738600.3

(51) Int. Cl.

| | |
|---|---|
| ***H10F 77/70*** | (2025.01) |
| ***H10F 71/00*** | (2025.01) |
| ***H10F 77/20*** | (2025.01) |

(52) U.S. Cl.
CPC ......... *H10F 77/703* (2025.01); *H10F 71/129* (2025.01); *H10F 77/211* (2025.01)

(58) Field of Classification Search
CPC .... H10F 71/129; H10F 77/147; H10F 77/211; H10F 77/488; H10F 77/703
See application file for complete search history.

(56) References Cited

U.S. PATENT DOCUMENTS

2009/0308438 A1* 12/2009 De Ceuster ........... H10F 10/146 257/E31.032
2019/0019904 A1 1/2019 Westerberg et al.
(Continued)

FOREIGN PATENT DOCUMENTS

EP 4572568 A1 6/2025

OTHER PUBLICATIONS

Zhejiang Jinko Solar Co., Ltd et al., European Communication pursuant to Article 94(3) EPC, EP24160410.7, Feb. 3, 2026, 7 pgs.

*Primary Examiner* — Mayla Gonzalez Ramos
(74) *Attorney, Agent, or Firm* — USCH Law, PC

(57) ABSTRACT

Provided are a solar cell, a method for preparing a photovoltaic module, and a photovoltaic module. The solar cell includes: a substrate, a first dielectric layer and a first doped conductive layer. The substrate has a first surface and a second surface opposite to the first surface. The first surface includes alternating electrode regions and non-electrode regions, and transition regions, each respective transition region of the transition regions being abutted on one side by a respective electrode region of the electrode regions and on an opposing side by a respective non-electrode region of the non-electrode regions. The transition region includes a plurality of spaced first pyramid structures and a plurality of micro-convex structures, and a one-dimensional size of a bottom of a respective micro-convex structure is smaller (Continued)

than a one-dimensional size of a bottom of a respective first pyramid structure.

20 Claims, 7 Drawing Sheets

(56) References Cited

U.S. PATENT DOCUMENTS

2020/0135944 A1* 4/2020 Yi .......................... H10F 10/14
2022/0376124 A1* 11/2022 Feng .................... H10F 77/707

* cited by examiner

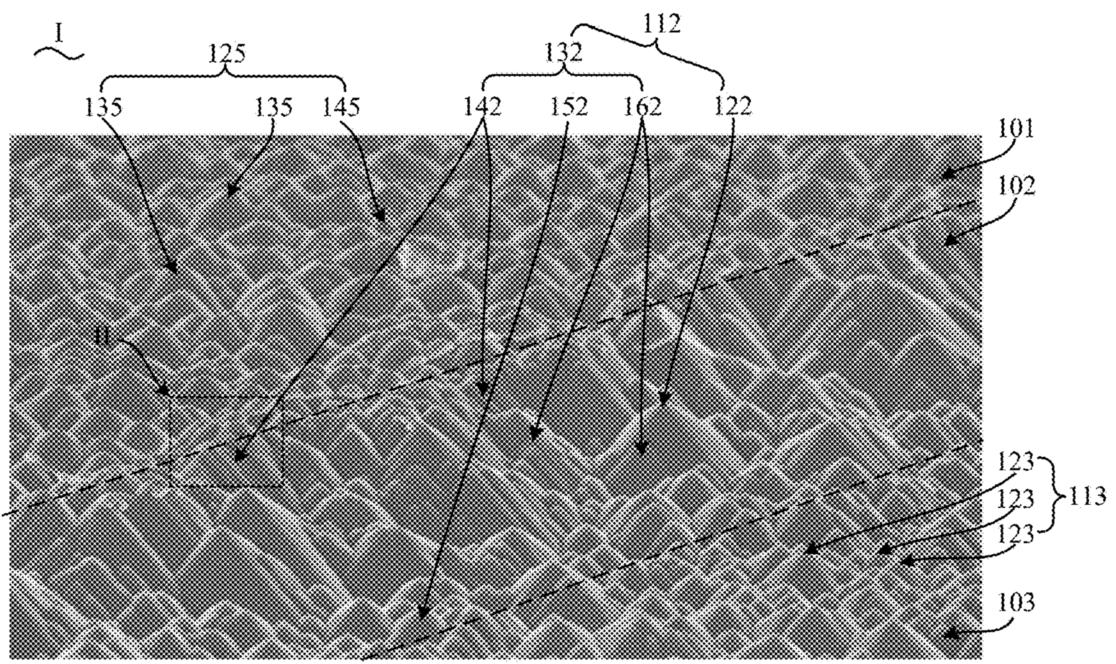
FIG. 3
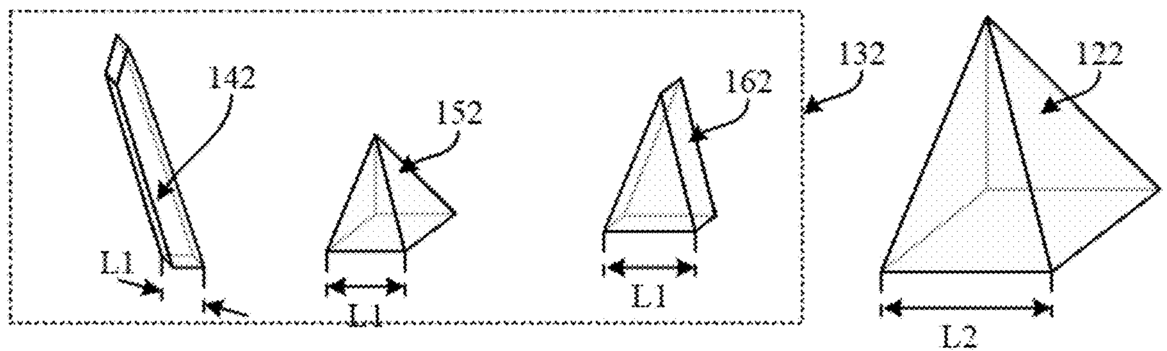
FIG. 4
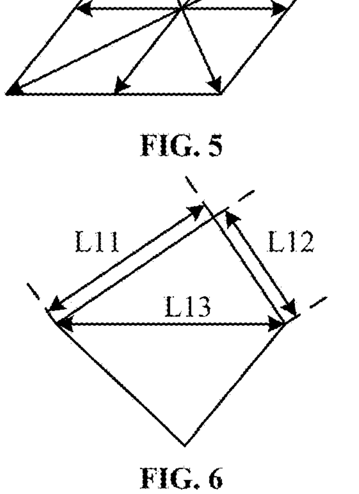
FIG. 5
FIG. 6

340
314
(304)
315
(305)
350
330
351
(371)
372
373
361

340
314
(304)
315
(305)
308
350
330
344 (354)
345 (355)
351
(371)
372
373
361

42
40
402
41
42

SOLAR CELL, METHOD FOR PREPARING THE SAME, AND PHOTOVOLTAIC MODULE

CROSS REFERENCE TO RELATED APPLICATIONS

The present application is a continuation of U.S. patent application Ser. No. 18/593,812, filed on Mar. 1, 2024, which claims priority to Chinese Patent Application No. 202311738600.3, entitled "SOLAR CELL, METHOD FOR PREPARING THE SAME, AND PHOTOVOLTAIC MODULE," filed on Dec. 15, 2023, each of which is incorporated herein by reference in its entirety.

TECHNICAL FIELD

The various embodiments described in this document relate to the field of photovoltaics, and in particular, to a solar cell, a method for preparing a photovoltaic module, and a photovoltaic module.

BACKGROUND

At present, solar cells have wider applications as a new energy alternative solution. The solar cell generates carriers by using a photovoltaic effect principle and introduces the carriers out by using an electrode, which is conducive to effective utilization of the electric energy.

Existing solar cells mainly include an interdigitated back contact (IBC) cell, a tunnel oxide passivated contact (TOPCON) cell, a passivated emitter and real cell (PERC), a heterojunction with intrinsic thin-layer (HIT) cell, and the like.

However, the photovoltaic conversion efficiency of currently designed solar cells needs to be further improved.

SUMMARY

Embodiments of the present disclosure provide a solar cell a method for preparing a photovoltaic module, and a photovoltaic module, which at least facilitates improving the light absorption efficiency of the solar cell.

According to some embodiments of the present disclosure, an aspect of the embodiments of the present disclosure provides a solar cell. The solar cell includes a substrate, a first dielectric layer, and a first doped conductive layer. The substrate has a first surface and a second surface opposite to the first surface. The first surface includes alternating electrode regions and non-electrode regions, and transition regions, where each respective transition region is abutted on one side by a respective electrode region of the electrode regions and on an opposing side by a respective non-electrode region of the non-electrode regions, and includes a plurality of spaced first pyramid structures and a plurality of micro-convex structures, and a one-dimensional size of a bottom of a respective micro-convex structure of the plurality of micro-convex structures is smaller than a one-dimensional size of a bottom of a respective first pyramid structure of the plurality of first pyramid structures. The one-dimensional size of the bottom of the respective micro-convex structure or the respective first pyramid structure is one of a length or a diagonal length of an orthographic projection pattern of the bottom of the respective micro-convex structure or the respective first pyramid structure, respectively, on the substrate. The plurality of spaced first pyramid structures are mixed with the plurality of micro-convex structures throughout the respective transition region. The first dielectric layer is formed over the respective electrode region. The first doped conductive layer is formed over the first dielectric layer.

In some embodiments, the plurality of micro-convex structures include at least one of prism structures inclined toward the respective electrode region, second pyramid structures or triangular plate-like structures.

In some embodiments, the prism structures are disposed on sidewalls of the plurality of first pyramid structures; and/or, part of the prism structures are disposed in a part, proximate to the respective electrode region, of the respective transition region; and/or, part of the prism structures are sequentially arranged in a direction away from sidewalls of the plurality of first pyramid structures.

In some embodiments, a bottom of a respective second pyramid structure of the second pyramid structures is in a contact connection with a bottom of the respective first pyramid structure of the plurality of first pyramid structures; and/or, at least one second pyramid structure of the second pyramid structures is disposed in a spacing between two adjacent first pyramid structures of the plurality of first pyramid structures.

In some embodiments, the triangular plate-like structures are disposed on sidewalls of the plurality of first pyramid structures; and/or, part of the triangular plate-like structures are sequentially arranged in a direction away from sidewalls of the plurality of first pyramid structures.

In some embodiments, a material of the first doped conductive layer includes at least one of silicon carbide, amorphous silicon, microcrystalline silicon, or polycrystalline silicon.

In some embodiments, a surface of the first doped conductive layer formed over the respective electrode region has a second surface structure including a plurality of third pyramid structures; and the respective non-electrode region has a third surface structure including a plurality of fourth pyramid structures. The one-dimensional size of the bottom of the respective first pyramid structure is larger than a one-dimensional size of a bottom of a respective third pyramid structure of the plurality of third pyramid structures, and the one-dimensional size of the bottom of the respective third pyramid structure is larger than a one-dimensional size of a bottom of a respective fourth pyramid structure of the plurality of fourth pyramid structures.

In some embodiments, the electrode regions include positive electrode regions and negative electrode regions. The first dielectric layer includes first sub-dielectric portions and second sub-dielectric portions, each respective first sub-dielectric portion of the first sub-dielectric portions is formed over a respective positive electrode region of the positive electrode regions, and each respective second sub-dielectric portion of the second sub-dielectric portions is formed over a respective negative electrode region of the negative electrode regions. The first doped conductive layer includes first sub-doped conductive portions and second sub-doped conductive portions, a respective first sub-doped conductive portion of the first sub-doped conductive portions is disposed on a side of the respective first sub-dielectric portion facing away from the respective positive electrode region, a respective second sub-doped conductive portion of the second sub-doped conductive portions is disposed on a side of the respective second sub-dielectric portion facing away from the respective negative electrode region, and a type of a doping element in the respective first sub-doped conductive portion is different from a type of a doping element in the respective second sub-doped conductive portion.

In some embodiments, the respective electrode region has a fourth surface structure including a plurality of platform raised structures; and the respective non-electrode region has a fifth surface structure including a plurality of fifth pyramid structures. The one-dimensional size of the bottom of the respective first pyramid structure is greater than a one-dimensional size of a bottom of a respective fifth pyramid structure of the plurality of fifth pyramid structures.

In some embodiments, the respective electrode region has a first top surface, the respective non-electrode region has a second top surface, the first top surface is higher than the second top surface with the second surface as a reference, and a height difference between the first top surface and the second top surface is 0.5 μm to 10 μm.

According to some embodiments of the present disclosure, another aspect of the embodiments of the present disclosure provides a photovoltaic module. The photovoltaic module at least one cell string, an encapsulation glue film and a cover plate. Each cell string is formed by connecting the solar cells as described above or formed by connecting solar cells produced by using the method as described above. The encapsulation glue film is configured to cover a surface of the at least one cell string. The cover plate is configured to cover a surface of the encapsulation glue film facing away from the at least one cell string.

BRIEF DESCRIPTION OF THE DRAWINGS

One or more embodiments are described by way of example with reference to the corresponding figures in the accompanying drawings, and the exemplary description is not to be construed as limiting the embodiments. Elements in the accompanying drawings that have same reference signs are represented as similar elements, and unless otherwise particularly stated, the figures in the accompanying drawings are not drawn to scale. To describe the technical solutions of the embodiments of the present disclosure or the related art more clearly, the accompanying drawings that need to be used in the embodiments are briefly described below. Apparently, the accompanying drawings in the following description show only some embodiments of the present disclosure, and a person of ordinary skill in the art may still derive other drawings from these accompanying drawings without creative efforts.

FIG. 3 is a schematic diagram illustrating an enlarged scanning electron micrograph at a box I in FIG. 2.

FIG. 4 is a schematic diagram illustrating a stereo structure of a first pyramid structure and micro-convex structures in a solar cell according to an embodiment of the present disclosure.

FIG. 5 is a schematic diagram illustrating a top view of a bottom of a micro-convex structure according to an embodiment of the present disclosure.

FIG. 6 is another schematic diagram illustrating a top view of a bottom of a micro-convex structure according to an embodiment of the present disclosure.

DETAILED DESCRIPTION OF THE EMBODIMENTS

Figure 1:
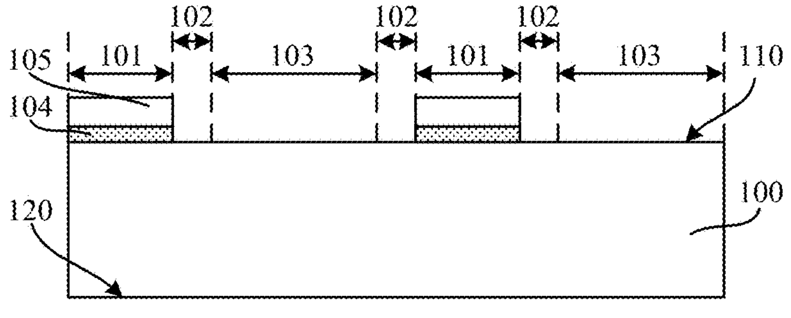
FIG. 1 is a schematic diagram illustrating a sectional view of a partial structure of a solar cell according to an embodiment of the present disclosure.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

In the drawings, the thickness of layers and an area has been enlarged for better understanding and ease of description. When it is described that a part, such as a layer, film, area, or substrate, is "over" or "on" another part, the part may be "directly" on another part or a third part may be present between the two parts. In contrast, when it is described that a part is "directly on" another part, it means that a third part is not present between the two parts. Furthermore, when it is described that a part is "generally" formed on another part, it means the part is not formed on the entire surface (or front surface) of another part and is also not formed in part of the edge of the entire surface.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

It can be known from the background that the photoelectric conversion efficiency of solar cells needs to be improved.

It is found that the reasons for the low photoelectric conversion efficiency of the solar cell include that a diffusion process is usually performed on a surface of the substrate to convert a part of the substrate into an emitter including a doping element of a different type from that of a doping element of the substrate, so that the emitter forms a PN junction with a non-diffused part of the substrate. However, such structure may lead to excessive recombination of carriers in the electrode region on the surface of the substrate, thereby affecting the open-circuit voltage and the photoelectric conversion efficiency of the solar cell.

Embodiments of the present disclosure provide a solar cell, a method for preparing a solar cell and a photovoltaic module. In the solar cell, on the one hand, a first dielectric layer and a first doped conductive layer stacked are designed over an electrode region, to improve the problem of severe carrier recombination in the electrode region through the passivation effect of the first dielectric layer and the first doped conductive layer on the electrode region, so as to improve the efficiency of collecting carriers in the substrate by the electrode subsequently formed over the electrode region; and on the other hand, the first dielectric layer and the first doped conductive layer are only formed over the electrode region to avoid the first dielectric layer and the first doped conductive layer from reducing the absorption of the non-electrode region and the transition region for incident light irradiated to the first surface. In addition, the transition region has a first surface structure, so that incident light incident to the transition region at different angles has an increased probability of being absorbed by the transition region via first pyramid structures and/or micro-convex structures, and an increased probability of being absorbed by the non-electrode region after being reflected to the non-electrode region via first pyramid structures and/or micro-convex structures, thereby facilitates improving the absorption rate of the first surface for incident light. Thus, the photoelectric conversion efficiency of the solar cell is improved by improving the problem of severe carrier recombination in the electrode region and by increasing the absorption rate of the first surface for incident light.

The following describes the embodiments of the present disclosure in detail with reference to the accompanying drawings. However, a person of ordinary skill in the art may understand that, in the embodiments of the present disclosure, many technical details are provided for better understanding of the embodiments of the present disclosure. However, the technical solutions claimed to be protected by the embodiments of the present disclosure may also be implemented even without the technical details and various changes and modifications based on the following embodiments.

An embodiment of the present disclosure provides a solar cell, which is described below in detail with reference to the accompanying drawings.

Referring to FIGS. 1 to 4, the solar cell includes: a substrate 100, having a first surface 110 and a second surface 120 opposite to the first surface 110, where the first surface 110 includes electrode regions 101 and non-electrode regions 103 that are spaced from each other and alternatingly arranged, and transition regions 102, where each transition region 102 of the transition regions 102 is provided between a respective electrode region 101 of the electrode regions 101 and a respective non-electrode region 103 of the non-electrode regions 103, and has a first surface structure 112, the first surface structure 112 includes a plurality of spaced first pyramid structures 122 and a plurality of micro-convex structures 132, and a one-dimensional size L1 of a bottom of a respective micro-convex structure 132 of the plurality of micro-convex structures 132 is smaller than a one-dimensional size L2 of a bottom of a respective first pyramid structure 122 of the plurality of spaced first pyramid structures 122; a first dielectric layer 104, formed over the respective electrode region 101; and a first doped conductive layer 105, disposed on a side of the first dielectric layer 104 facing away from the respective electrode region 101.

Figure 2:
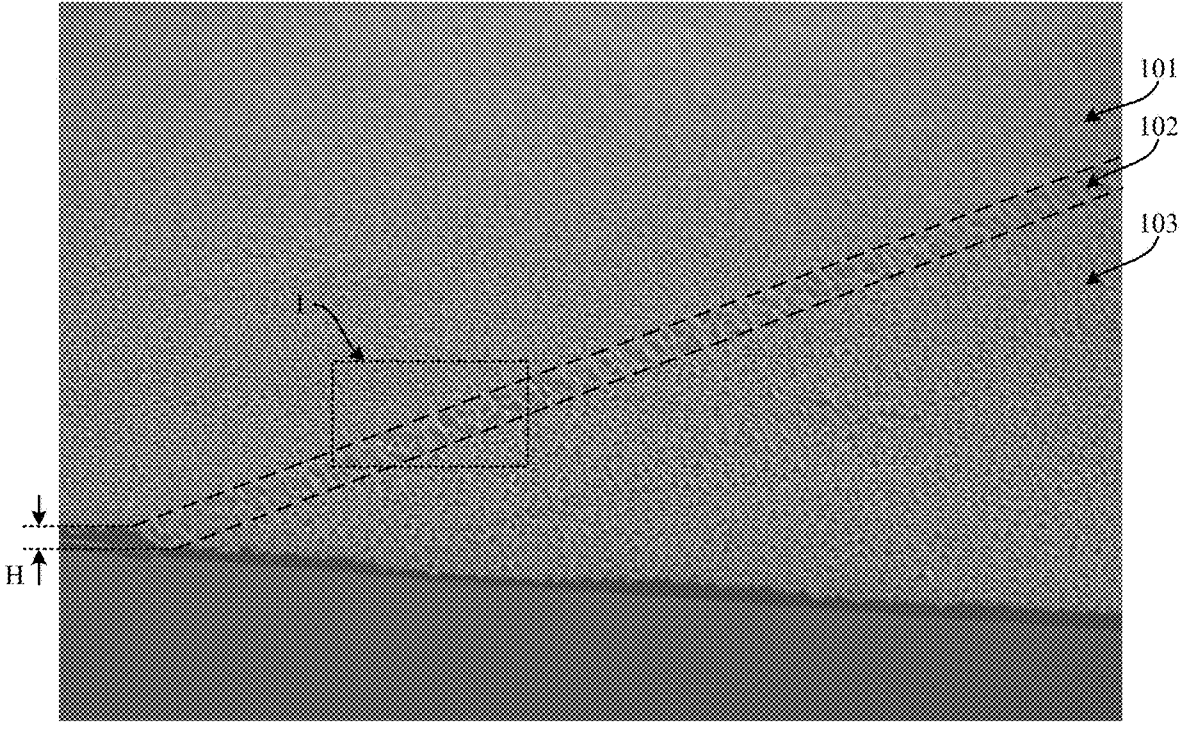
FIG. 2 is a schematic diagram illustrating a scanning electron micrograph of a partial stereo structure of a solar cell according to an embodiment of the present disclosure.

It should be noted that FIG. 1 is a schematic diagram illustrating a sectional view of a partial structure of a solar cell according to an embodiment of the present disclosure; FIG. 2 is a schematic diagram illustrating a scanning electron micrograph of a partial stereo structure of a solar cell according to an embodiment of the present disclosure; FIG. 3 is a schematic diagram illustrating an enlarged scanning electron micrograph at a box I in FIG. 2; and FIG. 4 is a schematic diagram illustrating a stereo structure of a first pyramid structure and micro-convex structures in a solar cell provided in an embodiment of the present disclosure. In addition, in order to exemplarily indicate approximate positions of the electrode region 101, the transition region 102, the non-electrode region 103, the first dielectric layer 104 and the first doped conductive layer 105, surface topographical characteristics of the substrate 100, the first dielectric layer 104 and the first doped conductive layer 105 are not embodied in FIG. 1.

Referring to FIG. 1, the first surface 110 includes a plurality of electrode regions 101, a plurality of transition regions 102, and a plurality of non-electrode regions 103. On the one hand, the first dielectric layer 104 and the first doped conductive layer 105 stacked are designed over the electrode regions 101, and the first dielectric layer 104 and the first doped conductive layer 105 form a passivation contact structure with respect to the electrode regions 101, which is conducive to improving a problem of severe carrier recombination of the electrode regions 101 by means of a chemical passivation effect of the first dielectric layer 104 on the electrode regions 101 and a field passivation effect of the first doped conductive layer 105 on the electrode regions 101, and improving the efficiency of collecting carriers in the substrate 100 by electrodes subsequently formed over the electrode regions 101; on the other hand, the first dielectric layer 104 and the first doped conductive layer 105 are only formed over the electrode regions 101, avoiding the first dielectric layer 104 and the first doped conductive layer 105 from reducing the absorption of the non-electrode regions 103 and the transition regions 102 for incident light irradiated to the first surface 110, i.e., facilitating improving the problem of severe carrier recombination in the electrode regions 101 while ensuring a relatively high absorption rate of the first surface 110 for incident light.

Furthermore, referring to FIG. 3, the first surface structure 112 has a plurality of spaced first pyramid structures 122. In addition to the discrete first pyramid structures 122, the first surface structure 112 further includes micro-convex structures 132, so that incident light incident to the transition region 102 at different angles has an increased probability of being absorbed by the transition region 102 via the first pyramid structures 122 and/or the micro-convex structures 132 after undergoing at least one reflection, and an increased probability of being absorbed by the non-electrode region 103 after undergoing at least one reflection to be reflected to the non-electrode region 103 via the first pyramid structures 122 and/or the micro-convex structures 132, thereby facilitates improving the absorption rate of the first surface 110 for incident light. In addition, a one-dimensional size L1 of a bottom of a respective micro-convex structure 132 is smaller than a one-dimensional size L2 of a bottom of a respective first pyramid structure 122, which facilitates a smoother transition from the electrode region 101 to the non-electrode region 103 through the first surface structure 112.

Thus, the photoelectric conversion efficiency of the solar cell is improved by improving the problem of severe carrier recombination in the electrode regions 101 and by increasing the absorption rate of the first surface 110 for incident light.

In some embodiments, an electrode region 101 refers to: a region within the substrate 100 which is aligned with a respective electrode along a thickness direction of the substrate 100, or may be understood as an orthographic projection region of a respective electrode on the substrate 100. In addition, a transition region 102 and a non-electrode region 103 refer to: a region within the substrate 100 which is not aligned with an electrode, or may be understood as an orthographic projection region of a part other than an electrode on the substrate 100, where the transition region 102 is located between the electrode region 101 and the non-electrode region 103. In practice, an area of an orthographic projection of the electrode region 101 on the substrate 100 may be greater than or equal to an area of an orthographic projection of the respective electrode on the substrate 100, which is conducive to ensuring that the entire contact area of the electrode with the substrate 100 is the electrode region 101.

It should be noted that, the electrodes described above are all electrodes described below as facing the first surface 110 of the substrate 100. If the above-described electrode region 101 and non-electrode region 103 are defined for a non-IBC battery described below, electrodes of two different polarities of the solar cell are located on two opposite sides of the substrate 100, and the electrodes described above are electrodes formed over the first surface 110; if the solar cell is an IBC battery or conductive electrodes of two different polarities are located on the same side of the substrate 100, an electrode region 101 refers to an area which is aligned with any one of electrodes of two polarities.

Embodiments of the present disclosure are described in more detail below in conjunction with the accompanying drawings.

In some embodiments, referring to FIGS. 3 and 4, the micro-convex structures 132 include at least one of prism structures 142 inclined toward the electrode region 101, second pyramid structures 152 or triangular plate-like structures 162.

It should be noted that the micro-convex structures 132 are exemplified in FIG. 3 as including a prism structure 142 inclined toward the electrode region 101, a second pyramid structure 152 and a triangular plate-like structure 162. In practice, for the first surface structure 112 in the same transition region 102, the micro-convex structures 132 may include only one, or any two, of prism structures 142 inclined toward the electrode region 101, second pyramid structures 152 or triangular plate-like structures 162. In addition to at least one of the prism structures 142 inclined toward the electrode region 101, the second pyramid structures 152 or the triangular plate-like structures 162, the micro-convex structures 132 may further include irregular granular structures.

Referring to FIGS. 4 to 6, the one-dimensional size L1 of the bottom of the respective micro-convex structure 132 is smaller than the one-dimensional size L2 of the bottom of the respective first pyramid structure 122. FIG. 5 is a schematic diagram illustrating a top view of a bottom of a micro-convex structure 132 according to an embodiment of the present disclosure; and FIG. 6 is another schematic diagram illustrating a top view of a bottom of a micro-convex structure 132 according to an embodiment of the present disclosure. In addition, in order to clearly illustrate characteristics of the first pyramid structure 122, the prism structures 142, the second pyramid structures 152 and the triangular plate-like structures 162, the first pyramid structure 122, the prism structures 142, the second pyramid structure 152, and the triangular plate-like structure 162 in FIG. 4 are all drawn in perspective.

It should be noted that with reference to FIG. 5, the one-dimensional size L1 of the bottom of the micro-convex structure 132 includes any one of a length, a width, or a diagonal length of an orthographic projection pattern of the bottom of the micro-convex structure 132 on the substrate 100. Furthermore, taking the orthographic projection pattern of the bottom of the micro-convex structure 132 on the substrate 100 being a regular quadrilateral as an example in FIG. 5, the one-dimensional size L1 of the bottom of the micro-convex structure 132 is any one of a length, a width, or a diagonal length of the regular quadrilateral.

In practice, the orthographic projection pattern of the bottom of the micro-convex structure 132 on the substrate 100 may also be an irregular polygon, in which case the length, width, or diagonal length of the orthographic projection pattern of the bottom of the micro-convex structure 132 on the substrate 100 is not absolute, but is artificially defined to characterize a one-dimensional size L1 of the bottom of the micro-convex structure 132. For example, with reference to FIG. 6, the orthographic projection pattern of the bottom of the micro-convex structure 132 on the substrate 100 is an irregular quadrilateral, and in this case, a length L11 of the orthographic projection pattern of the bottom of the micro-convex structure 132 on the substrate 100 may be defined as a side length of the longest side of the irregular quadrilateral, a width L12 of the orthographic projection pattern of the bottom of the micro-convex structure 132 on the substrate 100 may be defined as a side length of the shortest side of the irregular quadrilateral, and a diagonal length L12 of the orthographic projection pattern of the bottom of the micro-convex structure 132 on the substrate 100 may be defined as a side length of the longest diagonal of the irregular quadrilateral. It may be understood that the above is only an exemplary illustration, and the one-dimensional size L1 of the bottom of the micro-convex structure 132 may be flexibly defined according to actual needs in practice.

In addition, the orthographic projection pattern of the bottom of the micro-convex structure 132 on the substrate 100 may be an irregular polygon, a circle, or an irregular shape approximating a circle, in addition to the irregular quadrilateral. In this case, the one-dimensional size L1 of the bottom of the micro-convex structure 132 is an average value of lengths, widths, diagonal lengths or diameters of the plurality of regions of different specific areas selected from the bottom of the micro-convex structure 132, where the specific areas may be flexibly defined according to the actual requirements.

It should be noted that, with continued reference to FIG. 4, the orthographic projection pattern of the bottom of the first pyramid structure 122 on the substrate 100 is generally a regular quadrilateral, in which case the one-dimensional size L2 of the bottom of the first pyramid structure 122 is any one of a length, a width, or a diagonal length of the regular quadrilateral. In practice, the orthographic projection pattern of the bottom of the first pyramid structure 122 on the substrate 100 may be an irregular quadrilateral, in which case the definition of the one-dimensional size L2 of the bottom of the first pyramid structure 122 is similar to the definition of the one-dimensional size L1 of the orthographic projection pattern of the bottom of the micro-convex structure 132 on the substrate 100 which is an irregular quadrilateral, and details are not described herein again.

In addition, one-dimensional sizes L2 of bottoms of different first pyramid structures 122 may be different or the same, but are within a numerical range; and one-dimensional sizes L1 of bottoms of different micro-convex structures 132 may be different or the same, but are also within a numerical range. The one-dimensional size L1 of the bottom of the respective micro-convex structure 132 being smaller than the one-dimensional size L2 of the bottom of the respective first pyramid structure 122 refers to that an average value of one-dimensional sizes L1 of bottoms of the plurality of micro-convex structures 132 on the transition region 102 is smaller than an average value of one-dimensional sizes L2 of bottoms of the plurality of first pyramid structures 122 on the transition region 102.

Specific characteristics of the prism structures 142 are described in detail below.

In some embodiments (i.e., one kind of embodiment), referring to FIG. 3, a prism structure 142 is disposed on a sidewall of a first pyramid structure 122. The arrangement of the prism structure 142 on the sidewall of the first pyramid structure 122 includes the following two scenarios: in some cases, one prism structure 142 is disposed on a sidewall of one first pyramid structure 122; and in other cases, a plurality of prism structures 142 are attached to the same sidewall of one first pyramid structure 122, with each of the plurality of prism structures 142 in a contact connection with the sidewall.

In other embodiments (i.e., another kind of embodiment), referring to FIG. 3, part of the prism structures 142 are disposed in a part of the transition region 102 proximate to the electrode region 101. For example, a prism structure 142 is disposed between a first pyramid structure 122 between the electrode region 101.

In other embodiments (i.e., yet another kind of embodiment), a plurality of prism structures 142 are sequentially arranged in a direction away from a sidewall of a first pyramid structure 122. For example, only one of the plurality of prism structures 142 closest to the sidewall of the first pyramid structure 122 is in a contact connection with the sidewall of the first pyramid structure 122.

It should be noted that a plurality of prism structures 142 in the same transition region 102 at least include the prism structures 142 in at least one of the above three kinds of embodiments. That is, the plurality of prism structures 142 in the same transition region 102 may have the characteristics of the prism structures 142 in all the above three kinds of embodiments, or have the characteristics of the prism structures 142 in any two of the above three kinds of embodiments, or have the characteristics of the prism structures 142 in any one of the above three kinds of embodiments.

Specific characteristics of the second pyramid structure 152 are described in detail below.

Figure 7:
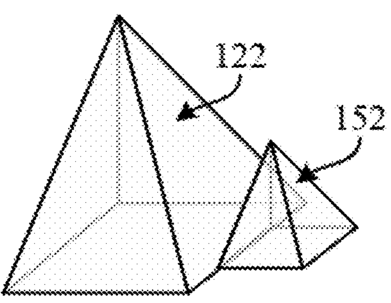
FIG. 7 is a schematic diagram exemplarily illustrating one arrangement of a second pyramid structure and a first pyramid structure according to an embodiment of the present disclosure.

In some embodiments (i.e., one kind of embodiment), referring to FIG. 7, FIG. 7 is a schematic diagram exemplarily illustrating one arrangement of a second pyramid structure 152 and a first pyramid structure 122 according to an embodiment of the present disclosure, where a bottom of the second pyramid structure 152 is in a contact connection with a bottom of the first pyramid structure 122. In some embodiments, a plurality of second pyramid structures 152 may surround a bottom of the same first pyramid structure 122, with a bottom of each of the plurality of second pyramid structures 152 in a contact connection with the bottom of the first pyramid structure 122.

Figure 8:
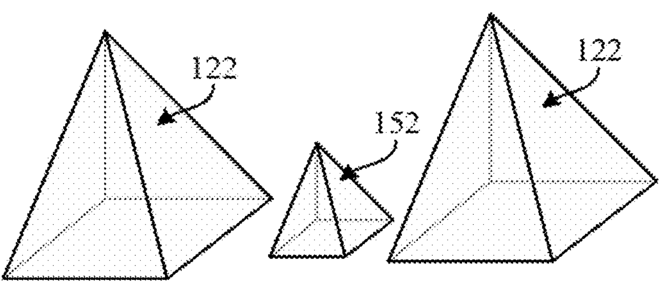
FIG. 8 is a schematic diagram exemplarily illustrating another arrangement of a second pyramid structure and a first pyramid structure according to an embodiment of the present disclosure.

In other embodiments (i.e., another kind of embodiment), referring to FIG. 8, FIG. 8 is a schematic diagram exemplarily illustrating another arrangement of a second pyramid structure 152 and a first pyramid structure 122 according to an embodiment of the present disclosure, where at least one second pyramid structure 152 is located in a spacing between two adjacent first pyramid structures 122. In other words, a bottom of the at least one second pyramid structure 152 is not in a contact connection with bottoms of the first pyramid structures 122.

It should be noted that the second pyramid structures 152 in the same transition region 102 at least include the second pyramid structures 152 in at least one of the above two kinds of embodiments. That is, a plurality of second pyramid structures 152 in the same transition region 102 may have the characteristics of the second pyramid structures 152 in both the above two kinds of embodiments, or have the characteristics of the second pyramid structures 152 in any one of the above two kinds of embodiments.

Specific characteristics of the triangular plate-like structure 162 are described in detail below.

In some embodiments (i.e., one kind of embodiment), referring to FIG. 3, triangular plate-like structures 162 are disposed on sidewalls of first pyramid structures 122. The arrangement of the triangular plate-like structures 162 on the sidewalls of the first pyramid structures 122 includes the following two scenarios: in some embodiments, one triangular plate-like structure 162 is disposed on a sidewall of one first pyramid structure 122; and in other embodiments, a plurality of triangular plate-like structures 162 are attached to the same sidewall of one first pyramid structure 122, with each of the plurality of triangular plate-like structures 162 in a contact connection with the sidewall.

In other embodiments (i.e., another kind of embodiment), with continued reference to FIG. 3, a plurality of triangular plate-like structures 162 are sequentially arranged in a direction away from a sidewall of a first pyramid structure 122. For example, only one of the plurality of triangular plate-like structures 162 closest to the sidewall of the first pyramid structure 122 is in a contact connection with the sidewall of the first pyramid structure 122.

It should be noted that triangular plate-like structures 162 in the same transition region 102 include the triangular plate-like structures 162 in at least one of the above two kinds of embodiments. That is, the plurality of triangular plate-like structures 162 in the same transition region 102 may have the characteristics of the triangular plate-like structures 162 in both the above two kinds of embodiments, or have the characteristics of the triangular plate-like structures 162 in any one of the above two kinds of embodiments.

In some embodiments, referring to FIG. 3, a first pyramid structure 122 is disposed in a part, proximate to the non-electrode region 103, of the transition region 102. In other words, the transition region 102 has a more typical first pyramidal structure 122 in the part, proximate to the non-electrode region 103, of the transition region 102.

It is to be noted that the first surface structure 112 of the transition region 102 is described above through various embodiments, that is, the first surface structure 112 has the diversity in structure. In some embodiments, the same transition region 102 has a plurality of micro-convex structures 132 in addition to first pyramidal structures 122, and specific features of micro-convex structures 132 in different transition region 10 are different. For example, one of two adjacent transition region 102 has prism structures 142 inclined toward the electrode region 101, and the other one of the two adjacent transition region 102 has second pyramid structures 152 and triangular plate-like structures 162.

The following is a detailed description of a solar cell constituting a double-sided TOPCON cell as an example.

Figure 9:
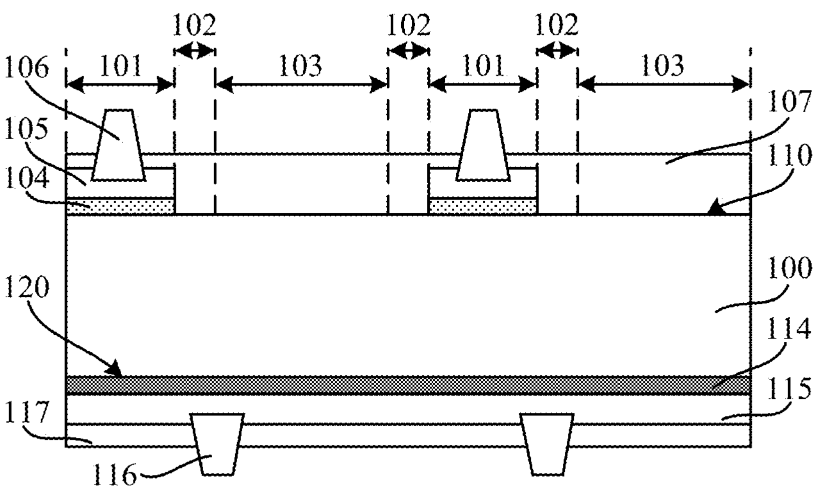
FIG. 9 is another schematic diagram illustrating a sectional view of a partial structure of a solar cell according to an embodiment of the present disclosure.

In some embodiments, with reference to FIG. 9, FIG. 9 is another schematic diagram illustrating a sectional view of a partial structure of a solar cell according to an embodiment of the present disclosure. The solar cell may further include: a second dielectric layer 114, covering the second surface 120; a second doped conductive layer 115, covering a surface of the second dielectric layer 114 facing away from the substrate 100, where a type of a doping element in the first doped conductive layer 105 is different from a type of a doping element in the second doped conductive layer 115.

In this way, both the front surface and the back surface of the substrate 100 can be configured to receive incident light or reflecting light, the first dielectric layer 104 and the first doped conductive layer 105 formed over the first surface 110 are configured to form a passivation contact structure of the first surface 110, and the second dielectric layer 114 and the second doped conductive layer 115 formed over the second surface 120 are configured to form a passivation contact structure of the second surface 120, to provide a passivation contact structure on each of the first surface 110 and the second surface 120, so that the solar cell constitutes a double-sided TOPCON cell. Thus, the passivation contact structures formed over the first surface 110 and the second surface 120 can play a role in reducing carrier recombination on the first surface 110 and the second surface 120 respectively, which greatly reduces the carrier loss of the solar cell compared with forming a passivation contact structure over only one of the surfaces of the substrate 100, thereby improving the open circuit voltage and the short circuit current of the solar cell.

By forming the passivated contact structures, the recombination of carriers on the surfaces of the substrate 100 can be reduced, thereby increasing the open-circuit voltage of the solar cell to enhance the photoelectric conversion efficiency of the solar cell.

It should be noted that in order to illustrate approximate positions of film layers such as the electrode region 101, the transition region 102, the non-electrode region 103, the first dielectric layer 104 and the first doped conductive layer 105 in the double-sided TOPCON cell, surface topographical characteristics of the substrate 100, the first dielectric layer 104 and the first doped conductive layer 105 are not embodied in FIG. 9.

In some embodiments, the first doped conductive layer 105 and the second doped conductive layer 115 have a field passivation effect, causing the minority carriers to escape from the interface, thereby decreasing the concentration of the minority carriers, so that carrier recombination rate at the interface of the substrate 100 is reduced, thereby increasing the open-circuit voltage, the short-circuit current and the fill factor of the solar cell, and improving the photovoltaic conversion performance of the solar cell.

In some embodiments, materials of the first doped conductive layer 105 and the second doped conductive layer 115 include at least one of silicon carbide, amorphous silicon, microcrystalline silicon, or polycrystalline silicon.

In some embodiments, the first dielectric layer 104 and the second dielectric layer 114 are configured to achieve interfacial passivation of the surfaces of the substrate 100, and have a chemical passivation effect, which is specifically that: by saturating dangling bonds of the surfaces of the substrate 100, the interfacial defect state density of the surfaces of the substrate 100 is reduced, thereby reducing recombination centers of the surfaces of the substrate 100.

In some embodiments, materials of the first dielectric layer 104 and the second dielectric layer 114 may include a dielectric material, which may be, for example, any one of silicon oxide, magnesium fluoride, silicon oxide, amorphous silicon, polycrystalline silicon, silicon carbide, silicon nitride, silicon oxynitride, aluminum oxide, or titanium oxide.

In some embodiments, the substrate 100 has an N-type or P-type doping element, where the N-type doping element may be a Group V element such as a phosphorus (P) element, a bismuth (Bi) element, an antimony (Sb) element or an arsenic (As) element, and the P-type doping element may be a Group III element such as a boron (B) element, an aluminum (Al) element, a gallium (Ga) element, or an indium (In) element. For example, when the substrate 100 is a P-type substrate 100, a type of a doping element in the substrate 100 is P-type; alternatively, when the substrate 100 is an N-type substrate 100, a type of a doping element in the substrate 100 is N-type.

In some embodiments, when the substrate 100 is an N-type substrate 100, the types of the doping elements in the first doped conductive layer 105 and the second doped conductive layer 115 include the following two scenarios: in some cases, the type of the doping element in the first doped conductive layer 105 is N-type and the type of the doping element in the second doped conductive layer 115 is P-type; and in other cases, the type of the doping element in the first doped conductive layer 105 is P-type and the type of the doping element in the second doped conductive layer 115 is N-type.

In some embodiments, when the substrate 100 is a P-type substrate 100, the types of the doping elements in the first doped conductive layer 105 and the second doped conductive layer 115 similarly include the following two scenarios: in some cases, the type of the doping element in the first doped conductive layer 105 is N-type and the type of the doping element in the second doped conductive layer 115 is P-type; and in other cases, the type of the doping element in the first doped conductive layer 105 is P-type and the type of the doping element in the second doped conductive layer 115 is N-type.

In some embodiments, in the double-sided TOPCON cell, the first surface 110 is a front surface of the substrate 100, and the second surface 120 is a back surface of the substrate 100. The passivation contact structure formed over the front surface is disposed only over the electrode region 101, while the passivation contact structure formed over the back surface is disposed on the entire surface. In these embodiments, when the type of the doping element in the first doped conductive layer 105 is different from the type of the doping element in the substrate 100, it is equivalent to providing a PN junction on the back surface of the substrate 100, easily causing carrier recombination on the back surface of the substrate 100. In this case, to adapt to the setting of different passivation contact structures over the front surface and the back surface of the substrate 100, a thickness of the first dielectric layer 104 may be set to be different from a thickness of the second dielectric layer 114. For example, the thickness of the first dielectric layer 104 may be smaller than the thickness of the second dielectric layer 114, which is conducive to improving the chemical passivation effect of the second dielectric layer 114 on the back surface of the substrate 100, further saturating the dangling bonds on the back surface of the substrate 100, and lowering the interfacial defect state density of the back surface of the substrate 100. Thus, the problem of the susceptibility to carrier recombination on the back surface of the substrate 100 is improved, so as to improve the filling factor, short circuit current and open circuit voltage.

In addition, the type of the doping element in the first doped conductive layer 105 is the same as the type of the doping element in the substrate 100, so that when a front electrode subsequently formed over the electrode region 101 is in electrical contact with the first doped conductive layer 105 over the front surface of the substrate 100, it is favorable to reduce metal contact recombination between the first doped conductive layer 105 and the front electrode, so that contact recombination of the carriers can be reduced to reduce the transmission loss of the current.

Figure 10:
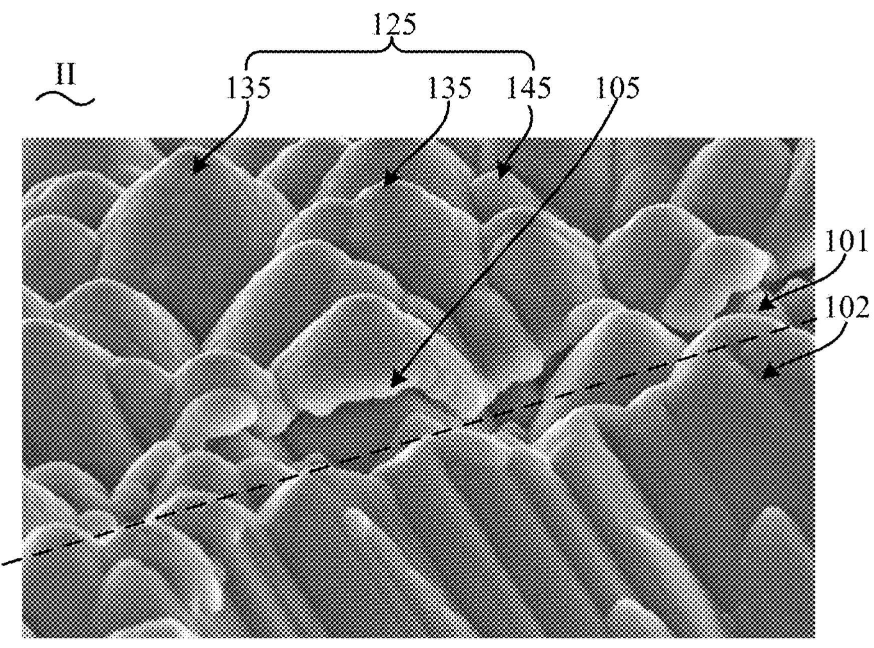
FIG. 10 is a schematic diagram illustrating an enlarged scanning electron micrograph at a box II in FIG. 3.

In some embodiments, with reference to FIGS. 3 and 10, FIG. 10 is a schematic diagram illustrating an enlarged scanning electron micrograph at a box II in FIG. 3, where the surface of the first doped conductive layer 105 formed over the electrode region 101 has a second surface structure 125 including a plurality of third pyramid structures 135.

It should be noted that since the thickness of the first dielectric layer 104 is very small relative to the thickness of the first doped conductive layer 105, only the first doped conductive layer 105 is embodied in FIG. 10 as being formed over the electrode region 101, with the first dielectric layer 104 between the electrode region 101 and the first doped conductive layer 105 not embodied. In addition, both the first dielectric layer 104 and the electrode region 101 below the first doped conductive layer 105 have the same or similar surface topography as the first doped conductive layer 105.

In some embodiments, with continued reference to FIG. 10, the second surface structure 125 mainly includes third pyramid structures 135, and also has other raised structures 145, where a plurality of third pyramid structures 135 are staggered. In practice, there is no limitation on the manner in which the plurality of third pyramid structures 135 are arranged.

In some embodiments, with reference to FIG. 3, the non-electrode region 103 has a third surface structure 113 including a plurality of fourth pyramid structures 123, where the one-dimensional size L2 of the bottom of the respective first pyramid structure 122 is larger than a one-dimensional size of a bottom of a respective third pyramid structure 135 of the plurality of third pyramid structures 135, and the one-dimensional size of the bottom of the respective third pyramid structure 135 is larger than a one-dimensional size of a bottom of a respective fourth pyramid structure 123 of the plurality of fourth pyramid structures 123.

It should be noted that the one-dimensional size of the bottom of the third pyramid structure 135 and the one-dimensional size of the bottom of the fourth pyramid structure 123 are both similar to the definition of the one-dimensional size L2 of the bottom of the first pyramid structure 122 in the preceding embodiments of the present disclosure, and details are not described herein again.

In addition, one-dimensional sizes of bottoms of different third pyramid structures 135 may be different or the same, but are within a numerical range; and one-dimensional sizes of bottoms of different fourth pyramid structures 123 may be different or the same, but are also within a numerical range. In this case, the one-dimensional size L2 of the bottom of the respective first pyramid structure 122 being greater than the one-dimensional size of the bottom of the respective third pyramid structures 135 refers to that an average value of one-dimensional sizes L2 of bottoms of the first pyramid structures 122 over the transition region 102 is greater than an average value of one-dimensional sizes of bottoms of the third pyramid structures 135 over the first doped conductive layer 105. The one-dimensional size of the bottom of the respective third pyramid structure 135 being greater than the one-dimensional size of the bottom of the respective fourth pyramid structure 123 refers to that the average value of the one-dimensional sizes of the bottoms of the third pyramid structures 135 over the first doped conductive layer 105 is greater than an average value of one-dimensional sizes of bottoms of the fourth pyramid structures 123 over the non-electrode region 103.

Furthermore, an embodiment of the present disclosure neither limits the magnitude relationship of the one-dimensional size of the bottom of the second pyramid structure 152 and the one-dimensional size of the bottom of the third pyramid structure 135, nor limits the magnitude relationship of the one-dimensional size of the bottom of the second pyramid structure 152 and the one-dimensional size of the bottom of the fourth pyramid structure 123.

It should be noted that the one-dimensional size L1 of the bottom of the respective micro-convex structure 132 is smaller than the one-dimensional size L2 of the bottom of the respective first pyramid structure 122, each of the one-dimensional size of the bottom of the respective third pyramid structure 135 and the one-dimensional size of the bottom of the respective fourth pyramid structure 123 is smaller than the one-dimensional size L2 of the bottom of the respective first pyramid structure 122, and the one-dimensional size of the bottom of the respective third pyramid structure 135 is larger than the one-dimensional size of the bottom of the respective fourth pyramid structure 123. Thus, in the first surface structure 112, the first pyramid structures 122 with a larger size is designed together with the micro-convex structures 132 with a smaller size, so that by the difference in size between the first pyramid structures 122 and the micro-convex structures 132 in the first surface structure 112, a smoother transition from the electrode region 101 to the non-electrode region 103 in the first surface 110 is enabled by means of the change in size of the structure of the first surface structure 112 itself.

In some embodiments, with continued reference to FIG. 9, the solar cell may further include: a front electrode 106, electrically connected to the first doped conductive layer 105. The PN junction formed on the back surface of the substrate 100 is configured to receive incident light and generate photo-generated carriers. The generated photo-generated carriers are transported from the substrate 100 to the first doped conductive layer 105, and then are transported into the front electrode 106 configured to collect the photo-generated carriers.

In some embodiments, a type of a doping element in the first doped conductive layer 105 is the same as type of a doping element in the substrate 100, facilitating reducing the loss of metal contact recombination between the front electrode 106 and the first doped conductive layer 105, which in turn can reduce the carrier contact recombination between the front electrode 106 and the first doped conductive layer 105, and improve the short-circuit current and the photovoltaic conversion performance of the solar cell.

In some embodiments, the surface of the first doped conductive layer 105 has the second surface structure 125 so that the contact area of the front electrode 106 with the front surface of the substrate 100 is relatively large, which facilitates reducing the contact resistance of the front electrode 106 with the front surface of the substrate 100. In other words, in the case of keeping the contact resistance of the front electrode 106 with the front face of the substrate 100 unchanged, a width of the front electrode 106 may be set to be relatively small, so that blocking of incident light by the front electrode 106 can be reduced, and the absorption capacity of the substrate 100 for the incident light can be improved.

In some embodiments, with continued reference to FIG. 9, the solar cell may further include: a back electrode 116, formed over the back surface of the substrate 100 and in electrical contact with the second doped conductive layer 115.

In some embodiments, with continued reference to FIG. 9, the solar cell may further include: a first passivation layer 107, covering surfaces of the transition region 102 and the non-electrode region 103 and covering surfaces of the first dielectric layer 104 and the first doped conductive layer 105 that are stacked, the front electrode 106 penetrating through the first passivation layer 107 to be in electrical contact with the first doped conductive layer 105.

In some embodiments, with continued reference to FIG. 9, the solar cell may further include: a second passivation layer 117, covering a surface of the second doped conductive layer 115 facing away from the second dielectric layer 114, the back electrode 116 penetrating through the second passivation layer 117 to be in electrical connection with the second doped conductive layer 115

In some embodiments, each of the first passivation layer 107 and the second passivation layer 117 may be a single-layer structure or a layered structure. Each of a material of the first passivation layer 107 and a material of the second passivation layer 117 may be at least one of silicon oxide, silicon nitride, silicon oxynitride, silicon oxycarbonitride, titanium oxide, hafnium oxide, or aluminum oxide. The following is a detailed description of a solar cell constituting an HJT cell as an example.

Figure 11:
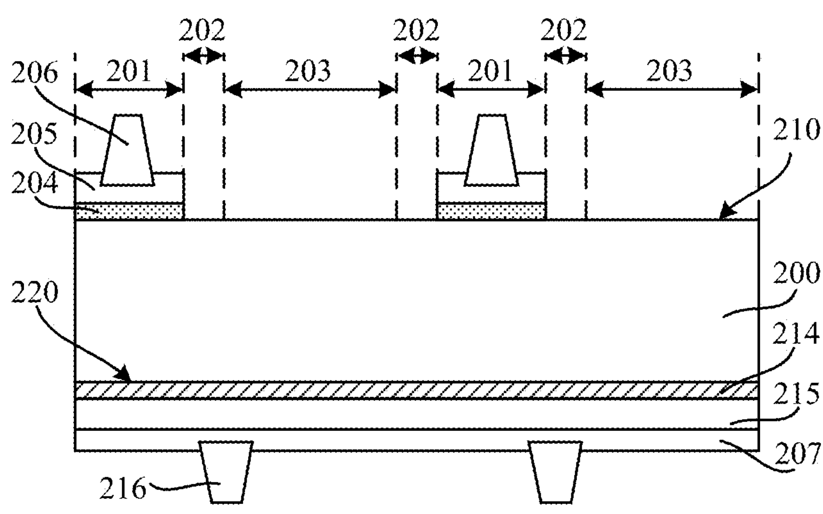
FIG. 11 is another schematic diagram illustrating a sectional view of a partial structure of a solar cell according to an embodiment of the present disclosure.

In some embodiments, referring to FIG. 11, the solar cell may further include: an intrinsic semiconductor layer 214, covering the second surface 220; a second doped conductive layer 215, covering a surface of the intrinsic semiconductor layer 214 facing away from the substrate 200, a type of a doping element in the first doped conductive layer 205 being different from a type of a doping element in the second doped conductive layer 215; and a transparent conductive layer 207, covering a surface of the second doped conductive layer 215 facing away from the intrinsic semiconductor layer 214.

It should be noted that the substrate 200, the first surface 210, the second surface 220, the electrode region 201, the transition region 202, the non-electrode region 203, the first dielectric layer 204, the first doped conductive layer 205, and the front electrode 206 in FIG. 11 are all similar to the corresponding structures in the preceding embodiments, and details are not described herein again. Further, surface topographies of the first surface 210, the second surface 220, the first dielectric layer 204, and the first doped conductive layer 205 are also similar to the corresponding surface topographies in the preceding embodiments, and details are not described herein again.

In addition, in order to illustrate approximate positions of film layers such as the electrode region 201, the transition region 202, the non-electrode region 203, the first dielectric layer 204, and the first doped conductive layer 205 in the HJT cell, surface topographical characteristics of the substrate 200, the first dielectric layer 204, and the first doped conductive layer 205 are not embodied in FIG. 11.

In some embodiments, the interface of the intrinsic semiconductor layer 214 in contact with the substrate 200 is conducive to improving the open-circuit voltage of the solar cell, and improving the passivation effect of the substrate 200, thereby facilitates improving the photoelectric conversion efficiency of the solar cell.

In some embodiments, a material of the intrinsic semiconductor layer 214 includes intrinsic amorphous silicon, silicon oxide, silicon nitride, or silicon carbide. In some embodiments, the intrinsic semiconductor layer 214 has a thickness of 2 microns to 10 microns. For example, the intrinsic semiconductor layer 214 has a thickness of 5 microns.

In some embodiments, a material of the second doped conductive layer 215 includes an N-type doped or P-type doped semiconductor film of amorphous silicon, amorphous silicon oxide, amorphous silicon carbide, microcrystalline silicon, hydrogenated microcrystalline silicon, microcrystalline silicon oxide, microcrystalline silicon carbide or polycrystalline silicon, or a layered composite film layer of combination thereof.

In some embodiments, the second doped conductive layer 215 has a thickness of 4 nm to 500 nm. Further, the second doped conductive layer 215 has a thickness ranging from 200 nm to 400 nm. For example, the second doped conductive layer 215 may have a thickness of 20 nm to 103 nm, 103 nm to 139 nm, 139 nm to 161 nm, 161 nm to 218 nm, 218 nm to 298 nm, or 298 nm to 500 nm.

In some embodiments, the second doped conductive layer 215 includes hydrogenated microcrystalline silicon, which is conducive to making the second doped conductive layer 215 have a larger bandgap and a narrower absorption spectral range, so that the photoelectric conversion efficiency of the solar cell can be effectively improved. With the increase of the crystallization rate, the series resistance is reduced and the filling factor is increased, thereby achieving the effect of improving the output current of the solar cell and effectively prolonging the life of the solar cell.

In some embodiments, a material of the transparent conductive layer 207 may include at least one of tin-doped indium oxide (ITO), aluminum-doped zinc oxide (AZO), cerium-doped indium oxide, and tungsten-doped indium oxide.

In some embodiments, a PN junction is formed between the second doped conductive layer 215 and the substrate 200. The intrinsic semiconductor layer 214 is inserted in the PN junction as a buffer layer. The intrinsic semiconductor layer 214 has a good passivation effect on the surface of the substrate 200, which can substantially avoid the recombination of carriers, thereby facilitates improving the minority carrier lifetime and improving the open-circuit voltage of the solar cell.

In some embodiments, with continued reference to FIG. 11, the solar cell may further include: a back electrode 216, being in electrical contact with the transparent conductive layer 207.

In some embodiments, the transparent conductive layer 207 is electrically conductive, and carriers can sequentially pass through the intrinsic semiconductor layer 214, the second doped conductive layer 215, and the transparent conductive layer 207, and ultimately be collected by the back electrode 216.

The following is a detailed description of a solar cell constituting an IBC cell as an example.

Figure 12:
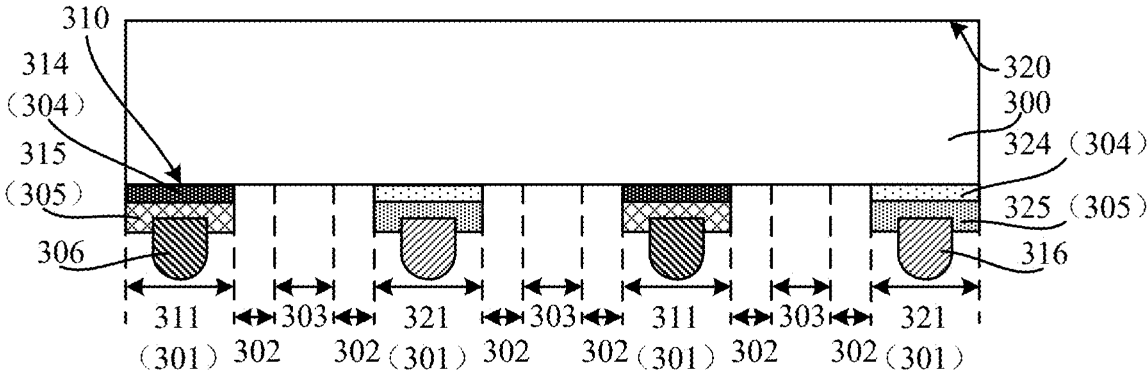
FIG. 12 is still another schematic diagram illustrating a sectional view of a solar cell according to an embodiment of the present disclosure.

In some embodiments, referring to FIG. 12, FIG. 12 is still another schematic diagram illustrating a sectional view of a partial structure of a solar cell according to an embodiment of the present disclosure, where the electrode region 301 is a positive electrode region 311 or a negative electrode region 321; the first dielectric layer 304 includes a first sub-dielectric portion 314 formed over the positive electrode region 311, and a second sub-dielectric portion 324 formed over the negative electrode region 321; the first doped conductive layer 305 includes a first sub-doped conductive portion 315 and a second sub-doped conductive portion 325, where the first sub-doped conductive portion 315 is disposed on a side of the first sub-dielectric portion 314 facing away from the positive electrode region 311, and the second sub-doped conductive portion 325 is disposed on a side of the second sub-dielectric portion 324 facing away from the negative electrode region 321, and a type of a doping element in the first sub-doped conductive portion 315 is different from a type of a doping element in the second sub-doped conductive portion 325.

It should be noted that the substrate 300, the first surface 310, the second surface 320, the transition region 302, and the non-electrode region 303 in FIG. 12 are all similar to the corresponding structures in the preceding embodiments, and details are not described herein again. However, a surface topography of the first surface 310 is different from that in the preceding embodiments.

Furthermore, in order to illustrate approximate positions of film layers such as the electrode region 301, the transition region 302, the non-electrode region 303, the first dielectric layer 304, and the first doped conductive layer 305 in the IBC cell, surface topographical characteristics of the substrate 300, the first dielectric layer 304, and the first doped conductive layer 305 are not embodied in FIG. 12.

In some embodiments, the first surface 310 in the IBC cell is a back surface of the substrate 300, and the second surface 320 is a front surface of the substrate 300.

In some embodiments, the substrate 300 also has a doping element. a type of a doping element in the first sub-doped conductive portion 315 is different from a type of the doping element in the substrate 300, and a type of a doping element in the second sub-doped conductive portion 325 is the same as the type of the doping element in the substrate 300.

Figure 13:
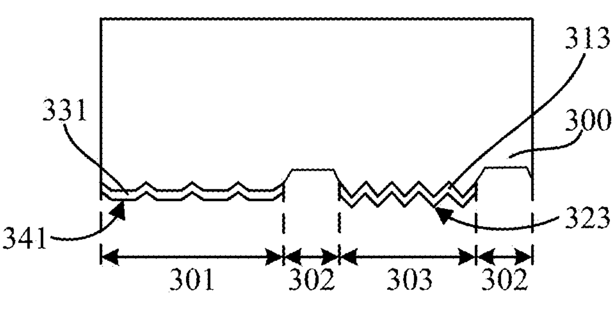
FIG. 13 is a schematic diagram illustrating a sectional view of a partial structure of a substrate in a solar cell according to an embodiment of the present disclosure.

In some embodiments, with reference to FIG. 13, FIG. 13 is a schematic diagram illustrating a sectional view of a partial structure of a substrate 300 in a solar cell according to an embodiment of the present disclosure, where the electrode region 301 has a fourth surface structure 331 including a plurality of platform protruding structures 341; and the non-electrode region 303 has a fifth surface structure 313 including a plurality of fifth pyramid structures 323. The one-dimensional size L2 (refer to FIG. 4) of the bottom of the respective first pyramid structure 122 (refer to FIG. 4) is larger than a one-dimensional size of a bottom of a respective fifth pyramid structure 323 of the plurality of fifth pyramid structures 323.

It should be noted that the surface topography of the transition region 302 in the IBC cell shown in FIGS. 12 and 13 is also similar to the corresponding surface topography in the previous embodiments, and details are not described herein again, and the surface topography of the transition region 302 is not embodied in FIGS. 12 and 13. Therefore, the one-dimensional size L2 of the bottom of the first pyramid structure 122 (refer to FIG. 4) herein adopts the labeling in the previous embodiments.

Furthermore, the definition of the one-dimensional size of the bottom of the fifth pyramid structure 323 is similar to the definition of the one-dimensional size L2 of the bottom of the first pyramid structure 122 in the embodiments of the present disclosure, and details are not described herein again. Moreover, one-dimensional sizes of bottoms of different fifth pyramid structures 323 may be different or the same, but are within a numerical range. In this case, the one-dimensional size L2 of the bottom of the respective first pyramid structure 122 being greater than the one-dimensional size of the bottom of the respective fifth pyramid structures 323 refers to that an average value of one-dimensional sizes of bottoms of the first pyramid structures formed over the transition region 302 is greater than an average value of one-dimensional sizes of bottoms of the fifth pyramid structures 323 formed over the non-electrode region 303.

In some embodiments, the platform protruding structure 341 is a pyramid base portion of a pyramid structure, i.e., a remaining structure of the pyramid structure after removing the tip. In other words, compared with a complete pyramid structure, the surface topography of the electrode region 301 is flatter, so that the first dielectric layer 304 and the first doped conductive layer 305 formed over the electrode region 301 also have a flatter topography, improving the uniformity of the first dielectric layer 304 and the first doped conductive layer 305 formed, thereby facilitating the enhancement of the passivation effect of the first dielectric layer 304 and the first doped conductive layer 305 on the electrode region 301, and further reducing the defect state density of the electrode region 301.

In the above embodiments, with reference to FIG. 2, the electrode region 101 has a first top surface, and the non-electrode region 103 has a second top surface. With the second surface 120 (refer to FIG. 1) as a reference, the first top surface is higher than the second top surface, and a height difference H between the first top surface and the second top surface is 0.5 μm to 10 μm.

It should be noted that the first top surface of the electrode region 101 is constituted by tips of a plurality of third pyramid structures 135 (refer to FIG. 3). Based on the fact that different third pyramid structures 135 have different sizes, the first top surface herein refers to a plane constituted by tips of the majority of the third pyramid structures 135 formed over the electrode region 101, and a proportion of the majority of the third pyramid structures 135 in the electrode region 101 can be flexibly selected according to the actual situation. Similarly, the second top surface of the non-electrode region 103 is constituted by tips of a plurality of fourth pyramid structure 123 (refer to FIG. 3).

In some embodiments, the height difference H between the first top surface and the second top surface may be 3 μm to 4 μm. For example, H may be 3.5 μm.

Figure 14:
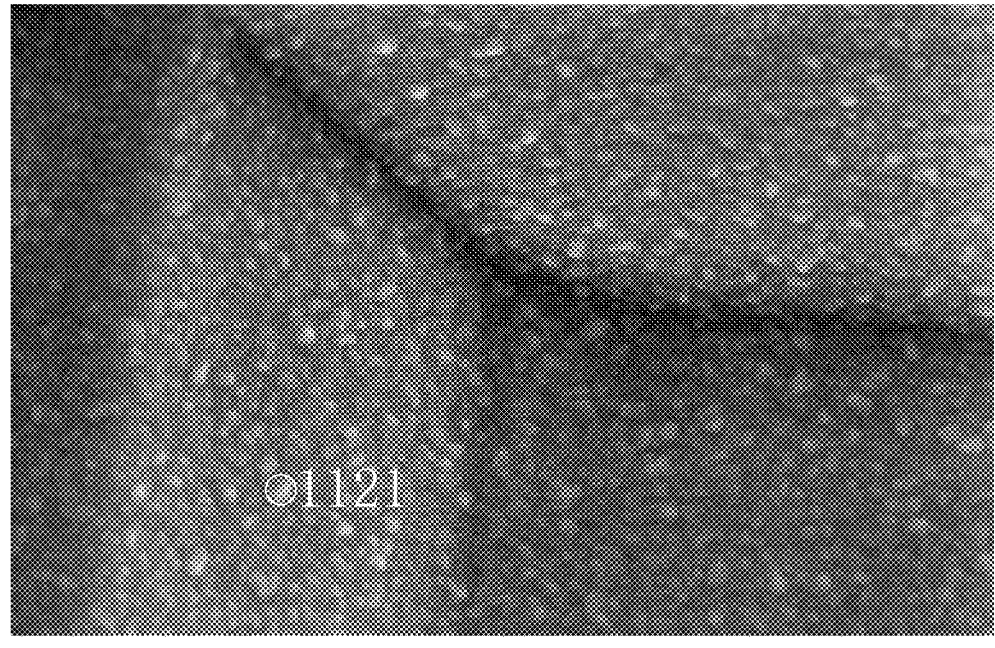
FIG. 14 is a scanning electron micrograph of a first doped conductive layer in a solar cell according to an embodiment of the present disclosure.
Figure 15:
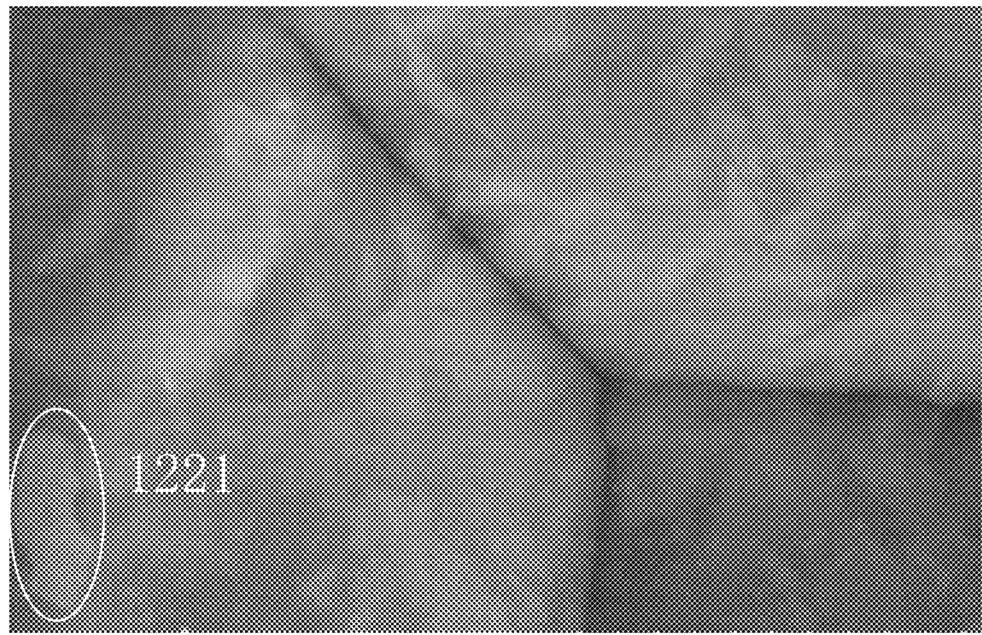
FIG. 15 is a scanning electron micrograph of a second doped conductive layer in a solar cell according to an embodiment of the present disclosure.

In some embodiments, FIG. 14 is a scanning electron micrograph of a first doped conductive layer in a solar cell according to an embodiment of the present disclosure; and FIG. 15 is a scanning electron micrograph of a second doped conductive layer in a solar cell according to an embodiment of the present disclosure. Referring to FIG. 14 and FIG. 9, in a double-sided TOPCON cell, when a type of a doping element in the first doped conductive layer 105 is N-type and a type of a doping element in the second doped conductive layer 115 is P-type, the first doped conductive layer 105 includes a plurality of first silicon grains 1121, and surfaces of the plurality of first silicon grains 1121 have a first roughness.

In some embodiments, a material of the first doped conductive layer 105 is doped polycrystalline silicon, and in the process of forming the first doped conductive layer 105, silicon atoms are arranged in a diamond lattice form to form a lot of crystal nuclei. These crystal nuclei grow to form grains with different crystal plane orientations, and these grains, when combined, crystallize into polycrystalline silicon. The first silicon grains refer to grains with different crystal plane orientations that constitute the polysilicon.

From the scanning electron micrograph of FIG. 14, a surface topography of the first doped conductive layer 105 can be visualized, where the first doped conductive layer 105 is constituted by a plurality of first silicon grains 1121, the unevenness of the plurality of first silicon grains 1121 builds up an uneven surface of the first doped conductive layer 105, and then the surface of the first doped conductive layer 105 has a first roughness.

In some embodiments, each first silicon grain 1121 has a grain size ranging from 10 nm to 300 nm. The grain size of the first silicon grain 1121 may be 10 nm to 53 nm, 53 nm to 95.3 nm, 95.3 nm to 138.2 nm, 138.2 nm to 200.6 nm, 200.6 nm to 248 nm, or 248 nm to 300 nm. The grain size of the first silicon grain 1121 within any of the above ranges makes the roughness of the surface constituted by the first silicon grains 1121 relatively large. The grain size of the first silicon grain 1121 within any of the above ranges makes the stability between adjacent first silicon grains 1121 relatively high, so that the first doped conductive layer 105 is less prone to crystalline deformation. In addition, the grain size of the first silicon grain 1121 within the above range makes a stress of the first doped conductive layer 105 on the first dielectric layer 104 relatively small, and thus the film layer performance between the first doped conductive layer 105 and the first dielectric layer 104 can be improved.

In some embodiments, the shape of the first silicon grain 1121 includes a granular shape. With fewer grain boundaries between granular grains and larger spaces between the grain boundaries compared with a bulk structure, the N-type doping element in the first doped conductive layer 105 can migrate through the spaces between the grain boundaries and ultimately be collected by the front electrode 106.

In some embodiments, the granular shape includes a spherical granular shape or a spherical-like granular shape. In some embodiments, the first dielectric layer 104 has a thickness of 0.5 nm to 5 nm. The thickness of the first dielectric layer 104 ranges from 0.5 nm to 1.3 nm, from 1.3 nm to 2.6 nm, from 2.6 nm to 4.1 nm, or from 4.1 nm to 5 nm. If the first dielectric layer 104 has a thickness in any of the above ranges, the first dielectric layer 104 is relatively thin, and the majority carriers can pass through the first dielectric layer 104 more easily for quantum tunneling, while it is difficult for the minority carriers to pass through the first dielectric layer 104, thereby achieving selective transport of carriers.

In some embodiments, the first doped conductive layer 105 has a thickness of 10 nm to 300 nm. For example, the first doped conductive layer 105 may have a thickness of 10 nm to 60 nm, 60 nm to 130 nm, 130 nm to 250 nm, or 250 nm to 300 nm.

With reference to FIGS. 9 and 15, the second doped conductive layer 115 is doped with a P-type doping element, where a surface of the second doped conductive layer 115 facing away from the second dielectric layer 114 has a second roughness, the second roughness being less than the first roughness.

In some embodiments, the second doped conductive layer 115 includes a plurality of second silicon grains 1221. Surfaces of the plurality of second silicon grains 1221 constitute the surface of the second doped conductive layer 115 having the second roughness. A grain size of each of the plurality of first silicon grains 1121 is smaller than a grain size of any one of the plurality of second silicon grains 1221.

In some cases, “roughness” in the “first roughness” and “second roughness” refers to an arithmetic mean of absolute values of vertical deviations of peaks and valleys within a sampling length with respect to a mean horizontal line. The roughness can be measured by a comparative method, a light cut method, an interferometric method or a needle tracing method.

In some embodiments, the grain size of the second silicon grain 1221 ranges from 100 nm to 900 nm. The grain size of the second silicon grain 1221 may be 100 nm to 250 nm, 250 nm to 360 nm, 360 nm to 490 nm, 490 nm to 584 nm, 584 nm to 610 nm, 610 nm to 790 nm, or 790 nm to 900 nm. With the grain size of the second silicon grain 1221 in any of the above ranges, the grain boundary between adjacent second silicon grains 1221 is relatively small, and the carriers can pass through the second doped conductive layer 115 more easily, thereby increasing the migration rate of the carriers, which is conducive to improving the cell efficiency.

In some embodiments, a shape of the second silicon grain 1221 includes a flake shape, a plate shape, or a granular shape. The micro-morphology of the second silicon grain 1221 shown in FIG. 15 is the flake shape.

FIGS. 14 and 15 respectively show a surface topography of the first doped conductive layer 105 (refer to FIG. 9) and a surface topography of the second doped conductive layer 115 (refer to FIG. 9) at the same magnification, where it can be seen that the surface of the first doped conductive layer 105 is rougher than the surface of the second doped conductive layer 115, that is, the first roughness is greater than the second roughness. In this way, based on the morphology difference between the first doped conductive layer 105 and the second doped conductive layer 115, for the first doped conductive layer 105 having a higher roughness, the surface of the first doped conductive layer 105 can improve the internal reflection of incident light, and reduce the optical loss of the solar cell, and a contact area between the front electrode 106 and the first doped conductive layer 105 can also be increased by the first doped conductive layer 105, thereby improving the contact property and weld tensile strength of the first doped conductive layer 105; for the second doped conductive layer 115 having a lower roughness, the surface of the second doped conductive layer 115 is relatively smooth, enabling a better uniformity of the passivation layer subsequently deposited thereon, so that the passivation layer has a better passivation performance, to improve the problem of recombination defect of the solar cell.

It should be noted that the shapes of the first silicon grains 1121 and the shapes of the second silicon grains 1221 are observed by a test means with magnification such as an electrical microscope or an optical microscope, where the electrical microscope may include a scanning electron microscope (SEM) of a conventional test means or an atomic force microscope (AFM). FIG. 14 shows a micro-topography of a first silicon grain 1121 shown by the scanning electron microscope, where it can be seen that the first silicon grain 1121 is presented in a granular shape with three-dimensionally equal lengths. FIG. 15 shows a micro-topography of a second silicon grain 1221 shown by the scanning electron microscope, where it can be seen that the second silicon grain 1221 is presented in a flake shape extending in a two-dimensional direction.

In some embodiments, referring to FIGS. 14 and 15, the grain size of each of the plurality of first silicon grains 1121 being smaller than the grain size of any one of the plurality of second silicon grains 1221 refers to that a radial one-dimensional size of each of the plurality of first silicon grains 1121 is less than a radial one-dimensional size of any one of the plurality of second silicon grains 1221; and a height of each of the plurality of first silicon grains 1121 is greater than a height of any one of the plurality of second silicon grains 1221. In this way, the roughness of the first doped conductive layer 105 constituted by the first silicon grains 1121 is greater than the roughness of the second doped conductive layer 115 constituted by the second silicon grains 1221.

In some embodiments, a radial one-dimensional size of a first silicon grain 1121 refers to a mean line length (or diameter) of the first silicon grain 1121; and a height of the first silicon grain 1121 refers to a distance between a side of the first silicon grain 1121 facing the first dielectric layer 104 and a side of the first silicon grain 1121 facing away from the first dielectric layer 104.

Similarly, a radial one-dimensional size of a second silicon grain 1221 refers to a mean line length (or diameter) of the second silicon grain 1221; and a height of the second silicon grain 1221 refers to a distance between a side of the second silicon grain 1221 facing the second dielectric layer 114 and a side of the second silicon grain 1221 facing away from the second dielectric layer 114.

In some embodiments, the second dielectric layer 114 has a thickness of 0.5 nm to 5 nm. The thickness of the second dielectric layer 114 ranges from 0.5 nm to 1.3 nm, from 1.3 nm to 2.6 nm, from 2.6 nm to 4.1 nm, or from 4.1 nm to 5 nm. If the second dielectric layer 114 has a thickness in any of the above ranges, the second dielectric layer 114 is relatively thin, and the majority carriers can pass through the second dielectric layer 114 more easily for quantum tunneling, while it is difficult for the minority carriers to pass through the second dielectric layer 114, thereby achieving selective transport of carriers.

In some embodiments, the first silicon grain 1121 is shaped as a granular shape with three-dimensionally equal lengths, and the height of the first silicon grain 1121 is equal to an average line length of the first silicon grain 1121; the second silicon grain 1221 is shaped as a flake shape extending in a two-dimensional direction, and the height of the second silicon grain 1221 is less than an average line length of the second silicon grain 1221. The height of the second silicon grain 1221 is a line length in a non-extended plane direction.

The measure of a size of a grain is called grain size. Common representation of the grain size includes a number of grains per unit volume (ZV), a number of grains per unit area (ZS) or an average line length (or diameter) of a grain. The average line length of the grain refers to a line length of an extension surface of the grain in an extension direction. The grain size in embodiments of the present disclosure may be an average line length of the grain.

It should be noted that in the HJT battery shown in FIG. 11, when the first doped conductive layer 205 has an N-type doping element and the second doped conductive layer 215 has a P-type doping element, the first doped conductive layer 205 also includes a plurality of first silicon grains 1121, with surfaces of the plurality of first silicon grains 1121 having a first roughness, and the second doped conductive layer 215 also includes a plurality of second silicon grains 1221, with surfaces of the plurality of second silicon grains 1221 having a second roughness. The relationship between the second roughness and the first roughness, as well as the relationship between the first silicon grains 1121 and the second silicon grains 1221, is similar to the corresponding features in the preceding double-sided TOPCON cell, and details are not described herein again.

Similarly, when in the IBC battery shown in FIG. 12, the first doped conductive layer 305 includes a first sub-doped conductive portion 315 and a second sub-doped conductive portion 325. One of the first sub-doped conductive portion 315 and the second sub-doped conductive portion 325 has an N-type doping element, and the other has a P-type doping element. In this case, the doped conductive layer doped with the N-type doping element also includes a plurality of first silicon grains 1121, with surfaces of the plurality of first silicon grains 1121 having a first roughness; and the doped conductive layer doped with the P-type doping element also includes a plurality of second silicon grains 1221, with surfaces of the plurality of second silicon grains 1221 having a second roughness. The relationship between the second roughness and the first roughness, as well as the relationship between the first silicon grains 1121 and the second silicon grains 1221, is similar to the corresponding features in the preceding double-sided TOPCON cell, and details are not described herein again.

In summary, on the one hand, the first dielectric layer 104 and the first doped conductive layer 105 stacked are designed over the electrode region 101 to improve the problem of severe carrier recombination in the electrode region 101 through the passivation effect of the first dielectric layer 104 and the first doped conductive layer 105 on the electrode region 101, so as to improve the efficiency of collecting carriers in the substrate 100 by the electrode subsequently formed over the electrode region 101; and on the other hand, the first dielectric layer 104 and the first doped conductive layer 105 are only formed over the electrode region 101 to avoid the first dielectric layer 104 and the first doped conductive layer 105 from reducing the absorption of the non-electrode region 103 and the transition region 102 for incident light irradiated to the first surface 110. In addition, the first surface structure 112 has pyramid structures 122 and micro-convex structures 132, so that incident light incident to the transition region 102 at different angles has an increased probability of being absorbed by the transition region 102 via the pyramid structures 122 and/or the micro-convex structures 132, and an increased probability of being absorbed by the non-electrode region 103 after being reflected to the non-electrode region 103 via the pyramid structures 122 and/or the micro-convex structures 132, thereby facilitates improving the absorption rate of the first surface 110 for incident light.

Another embodiment of the present disclosure also provides a method for preparing a solar cell, configured to produce the solar cell according to the preceding embodiments. The following describes the method for preparing a solar cell according to another embodiment of the present disclosure in detail with reference to the accompanying drawings. It should be noted that for parts the same as or corresponding to those in the preceding embodiments, details are not described herein again.

FIGS. 16 to 21 are schematic diagrams illustrating sectional views of partial structures corresponding to operations in a method for preparing a solar cell in another embodiment of the present disclosure.

Referring to FIGS. 16 to 21, the method for preparing the solar cell includes at least the following operations.

Figure 16:
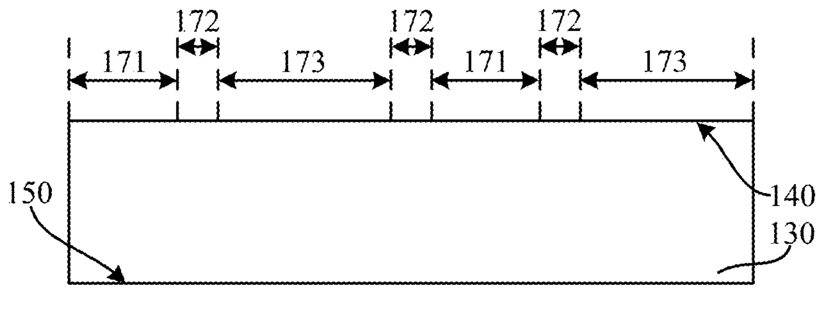
FIGS. 16 to 21 are schematic diagrams illustrating sectional views of partial structures corresponding to operations in a method for preparing a solar cell in another embodiment of the present disclosure.

In S11, referring to FIG. 16, an initial substrate 130 is provided. The initial substrate 130 has an initial first surface 140 and an initial second surface 150 that are opposite to each other. The initial first surface 140 includes initial electrode regions 171 and initial non-electrode regions 173 that are spaced from each other and alternatingly arranged, and initial transition regions 172, where each initial transition region 172 of the initial transition regions 172 is provided between a respective initial electrode region 171 of the initial electrode regions 171 and a respective initial non-electrode region 173 of the initial non-electrode regions 173.

In some embodiments, before forming a subsequent initial first dielectric layer, the method for preparing the solar cell may further include: subjecting the initial first surface 140 to a first etching process such that the initial first surface 140 has a first textured structure. That is, surfaces of the initial electrode region 171, the initial transition region 172, and the initial non-electrode region 173 all have a similar textured structure, which may be a pyramid structure. The first etching process may include: chemical etching, such as cleaning the surface of the initial substrate 130 with a mixed solution of potassium hydroxide and hydrogen peroxide, which may be specifically that: a concentration ratio of potassium hydroxide to hydrogen peroxide is controlled to form the initial first surface 140 with an expected morphology. In other embodiments, the texturing process may alternatively be performed by laser etching, a mechanical method, plasma etching, or the like.

In S12, an initial first dielectric layer covering the initial first surface 140 is formed. In S13, an initial first doped conductive layer covering a surface of the initial first dielectric layer facing away from the initial substrate 130 is formed. In S14, portions, formed over the initial transition regions 172 and the initial non-electrode regions 173, of the initial first dielectric layer and the initial first doped conductive layer are removed by a laser process, to form a substrate 100 having a first surface 110.

It should be noted that operations S12 to S14 are different in order to form different types of batteries, which are respectively described in detail subsequently.

With reference to FIG. 16 in combination with FIGS. 1 to 4, the initial electrode region 171, the initial transition region 172, and the initial non-electrode region 173 subjected to the laser process are an electrode region 101, a transition region 102, and a non-electrode region 103, respectively. The transition region 102 has a first surface structure 112. The first surface structure 112 includes a plurality of spaced first pyramid structures 122 and a plurality of micro-convex structures 132. A one-dimensional size L1 of a bottom of a respective micro-convex structure 132 of the plurality of micro-convex structures 132 is smaller than a one-dimensional size L2 of a bottom of a respective first pyramid structure 122 of the plurality of spaced first pyramid structures 122. A remaining portion of the initial first dielectric layer formed over the electrode region 101 is a first dielectric layer 104, and a remaining portion of the initial first doped conductive layer formed over the electrode region 101 is a first doped conductive layer 105.

Steps S12 to S14 are described in detail below with the formation of a double-sided TOPCON cell as an example.

Figure 17:
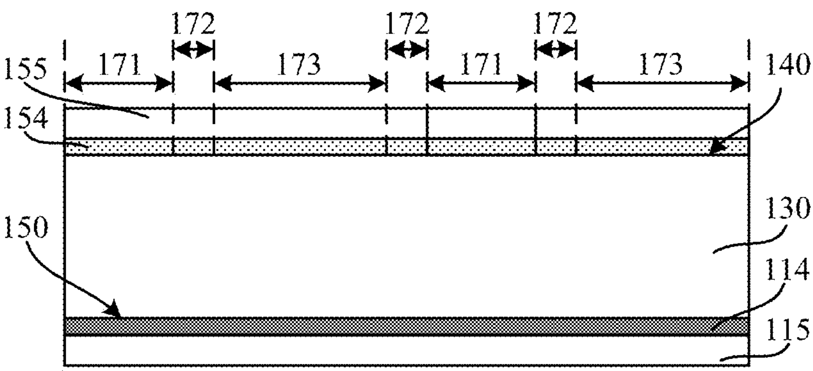

In S12, referring to FIG. 17, an initial first dielectric layer 154 covering the initial first surface 140 is formed.

In some embodiments, referring to FIG. 17, the operation of forming the initial first dielectric layer 154 may further include: forming a second dielectric layer 114 covering the initial second surface 150. In this way, forming the initial first dielectric layer 154 and the second dielectric layer 114 in the same process operation not only saves the process, but also reduces the number of times of de-plating compared with forming the initial first dielectric layer 154 and the second dielectric layer 114 separately.

In some cases, if the initial first dielectric layer 154 is formed over the initial first surface 140 first, a protective layer needs to be formed on the initial second surface 150 first to prevent the operation of forming the initial first dielectric layer 154 from affecting the initial second surface 150. Moreover, in the operation of forming the initial first dielectric layer 154, plating will also be formed on sidewalls of the initial substrate 130. Therefore, after forming the initial first dielectric layer 154, a first de-plating operation needs to be performed on the sidewalls of the initial substrate 130. After the first de-plating operation, the second dielectric layer 114 is then formed on the initial second surface 150. A protective layer needs to be formed on the initial first surface 140 first in order to prevent the process of forming the second dielectric layer 114 from affecting the initial first surface 140. In addition, plating is also formed on the sidewalls of the initial substrate 130 in the operation of forming the second dielectric layer 114. Therefore, after forming the second dielectric layer 114, a second de-plating operation is further required.

In some instances, the de-plating operation requires a chemical wet process to clean the plating formed on the sidewalls of the initial substrate 130. In other words, the de-plating operation not only removes the plating, but also causes damage to the initial substrate 130 due to the chemical wet process. In an embodiment of the present disclosure, the initial first dielectric layer 154 and the second dielectric layer 114 are formed at the same time, so that on the one hand, the operations of forming protective layers on the initial first surface 140 and the initial second surface 150 respectively can be eliminated, and an operation of removing the plating can be carried out only once after the formation of the initial first dielectric layer 154 and the second dielectric layer 114, so that the process operations can be simplified greatly to improve the process efficiency. Moreover, since there is no need to form protective layers on the initial first surface 140 and the initial second surface 150, the need to remove the protective layers subsequently is also eliminated, thereby avoiding process damage to the initial substrate 130 caused by the operations of removing the protective layers, and maintaining a better performance of the initial substrate 130.

In S13, with continued reference to FIG. 17, an initial first doped conductive layer 155 covering a surface of the initial first dielectric layer 154 facing away from the initial substrate 130 is formed.

In some embodiments, with continued reference to FIG. 17, the operation of forming the initial first doped conductive layer 155 may further include: forming a second doped conductive layer 115 covering a surface of the second dielectric layer 114 facing away from the initial substrate 130, a type of a doping element in the initial first doped conductive layer 155 being different from a type of a doping element in the second doped conductive layer 115. It should be noted that the first doped conductive layer 105 (refer to FIG. 9) is subsequently formed based on the initial first doped conductive layer 155, and thus the type of the doping element in the first doped conductive layer 105 is different from the type of the doping element in the second doped conductive layer 115.

Forming the initial first doped conductive layer 155 and the second doped conductive layer 115 in the same process operation not only saves the process, but also reduces the number of times of de-plating, compared with forming the initial first doped conductive layer 155 and the second doped conductive layer 115 separately.

In some embodiments, forming the initial first doped conductive layer 155 and the second doped conductive layer 115 may include the following operations.

The initial first surface 140 and the initial second surface 150 are simultaneously subjected to the first deposition process to form a first amorphous silicon layer over a surface of the initial first dielectric layer 154 facing away from the initial substrate 130 and a second amorphous silicon layer over a surface of the second dielectric layer 114 facing away from the initial substrate 130. For example, the first amorphous silicon layer and the second amorphous silicon layer may be formed by plasma chemical vapor deposition.

The first amorphous silicon layer and the second amorphous silicon layer are simultaneously subjected to crystallization processing to convert the first amorphous silicon layer into a first polycrystalline silicon layer, and the second amorphous silicon layer into a second polycrystalline silicon layer. In some embodiments, the crystallization processing includes performing an annealing heat treatment on the first amorphous silicon layer and the second amorphous silicon layer at an annealing temperature of 800° C. to 1200° C. In this temperature range, on the one hand, the annealing temperature is made not too small, so that sufficient crystallization of the first amorphous silicon layer and the second amorphous silicon layer can be ensured; on the other hand, the annealing temperature is made not too high, so that the problem of damaging the initial substrate 130 due to too high annealing temperature can be prevented.

After forming the first polycrystalline silicon layer and the second polycrystalline silicon layer, the first polycrystalline silicon layer is subjected to a first doping process to form an initial first doped conductive layer 155. In some embodiments, the doping element in the first doping process is also diffused into a portion of the initial substrate 130 to form a diffusion region, so that a concentration of the doping element in the diffusion region is greater than a concentration of the doping element in the remaining portion of the initial substrate 130. That is, the diffusion region is a heavily doped region relative to the remaining portion of the initial substrate 130. The heavily doped region and the remaining portion of initial substrate 130 form a high-low junction which enables the carriers to generate a barrier effect. Thus, the transport rate and the number of carriers transported from the subsequently formed substrate 100 to the diffusion region are increased, and hence the subsequently formed first doped conductive layer can collect the carriers effectively.

In some embodiments, before the operation of subjecting the first polycrystalline silicon layer to the first doping process, the method may further include: forming a first mask layer on a surface of the second polysilicon layer facing away from the initial substrate 130, and before the operation of forming the second doped conductive layer, the method further includes: removing the first mask layer. Since the first doping process and the second doping process subsequently performed on the second polysilicon layer are carried out in different process operations, forming the first mask layer on the surface of the second polysilicon layer before subjecting the first polycrystalline silicon layer to the first doping process is beneficial to protecting the second polysilicon layer from the first doping process.

In some embodiments, the first doping process may be either an ion implantation process or a source diffusion process.

In some embodiments, after forming the initial first doped conductive layer 155, the first mask layer is removed by an etching process. The etching process may include any one of a dry etching process, a wet etching process, or a laser etching process.

After subjecting the first polycrystalline silicon layer to the first doping process, the second polysilicon layer is subjected to a second doping process to form a second doped conductive layer 115. In some embodiments, a type of a doping element in the second doped conductive layer 115 is different from a type of a doping element in the initial substrate 130, such that a PN junction is formed between the second doped conductive layer 115 and the subsequently formed substrate 100 (refer to FIG. 9) to form a back junction structure. Since the second doped conductive layer 115 is formed over the entire back surface of the substrate 100, an area of the PN junction is made relatively large, so that on the one hand, the number of photo-generated carriers generated by the PN junction is relatively large, and on the other hand, the electrostatic field formed by the second doped conductive layer 115 pointing to the back surface of the substrate 100 is relatively large, which facilitates the migration of carriers and improving the open-circuit voltage and the short-circuit current. In addition, forming the PN junction on the back surface can also prevent the problem of severe carrier recombination in the electrode region 101 on the front surface of the substrate 100 due to the formation of the PN junction on the front surface of the substrate 100, thereby enhancing the double-sided rate.

In some embodiments, the second doping process may be either an ion implantation process or a source diffusion process.

In S14, with reference to FIG. 17 and FIG. 1, portions, formed over the initial transition regions 172 and the initial non-electrode regions 173, of the initial first dielectric layer 154 and the initial first doped conductive layer 155 are removed by a laser process to form a substrate 100 having a first surface 110.

In some embodiments, the initial first surface 140 has a first textured structure, and in the operation of removing portions, formed over the initial transition regions 172 and the initial non-electrode regions 173, of the initial first dielectric layer 154 and the initial first doped conductive layer 155 by the laser process, with reference to FIG. 16, FIG. 9 and FIG. 3, the first doped conductive layer 105 formed over the initial electrode region 171 has a second surface structure 125, the first textured structure in the initial transition region 172 is transformed into a first surface structure 112, and the first textured structure in the initial non-electrode region 173 is transformed into a third surface structure 113. The second surface structure 125 includes a plurality of third pyramid structures 135, and the third surface structure 113 includes a plurality of fourth pyramid structures 123. A one-dimensional size of the bottom of the respective first pyramid structure 122 is larger than a one-dimensional size of a bottom of a respective third pyramid structure 135 of the plurality of third pyramid structures 135, and the one-dimensional size of the bottom of the respective third pyramid structure 135 is larger than a one-dimensional size of a bottom of a respective fourth pyramid structure 123 of the plurality of fourth pyramid structures 123.

It should be noted that process parameters of the laser process can be adjusted to fine-tune the first surface structure 112.

Steps S12 to S14 are described in detail below with the formation of an HJT battery as an example.

It should be noted that with reference to FIG. 11, the operations of forming the substrate 200, the first dielectric layer 204, and the first doped conductive layer 205 in the operations of forming the HJT cell are similar to the operations of forming the substrate 100, the first dielectric layer 104, and the first doped conductive layer 105 in the double-sided TOPCON cell as described above, and details are not described herein again.

The operations of forming the HJT cell have the following main differences.

Figure 18:
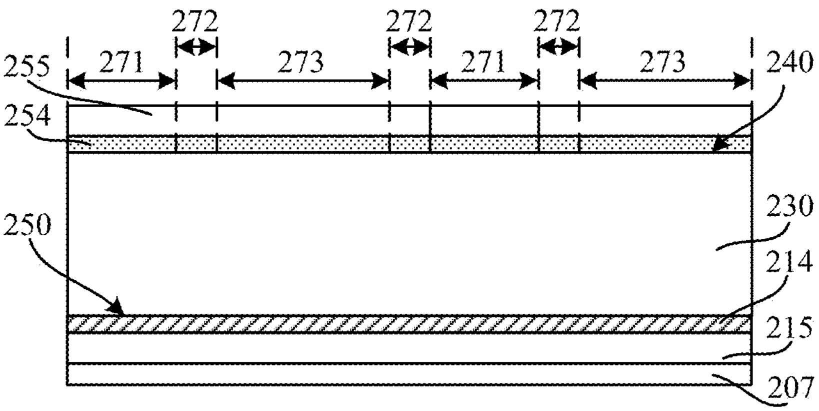

In some embodiments, referring to FIG. 18, before forming the initial first doped conductive layer 255, the method may further include: forming an intrinsic semiconductor layer 214 covering the initial second surface 250; the operation of forming the initial first doped conductive layer 255 may further include: forming a second doped conductive layer 215, covering a surface of the intrinsic semiconductor layer 214 facing away from the initial substrate 230, a type of a doping element in the initial first doped conductive layer 255 being different from a type of a doping element in the second doped conductive layer 215. After forming the second doped conductive layer 215, the method may further include: forming a transparent conductive layer 207, covering a surface of the second doped conductive layer 215 facing away from the intrinsic semiconductor layer 214.

It should be noted that the another embodiment of the present disclosure does not limit the sequence of forming the intrinsic semiconductor layer 214 and the initial first dielectric layer 254. In addition, the initial substrate 230, the initial first surface 240, the initial second surface 250, the initial electrode regions 271, the initial transition regions 272, the initial non-electrode regions 273, the initial first dielectric layer 254, and the initial first doped conductive layer 255 in FIG. 18 are all similar to the corresponding structures in the preceding embodiments, and details are not described herein again.

Steps S12 to S14 are described in detail below with the formation of an IBC cell as an example.

Figure 19:
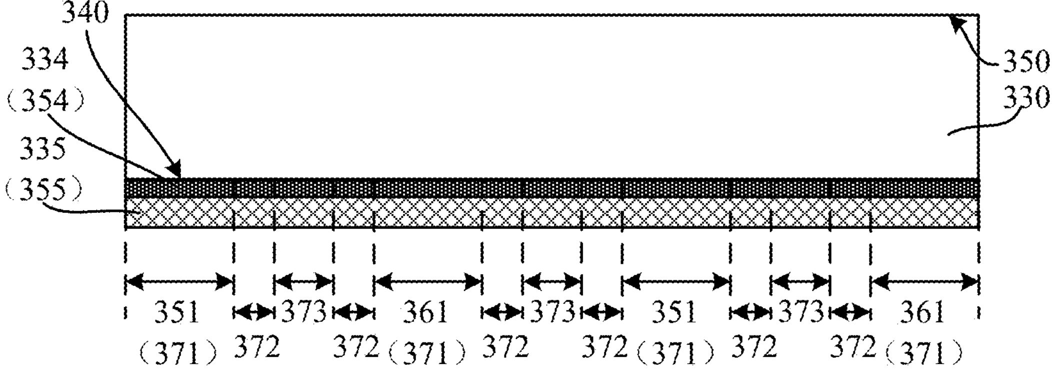
Figures 20, 21, 22:
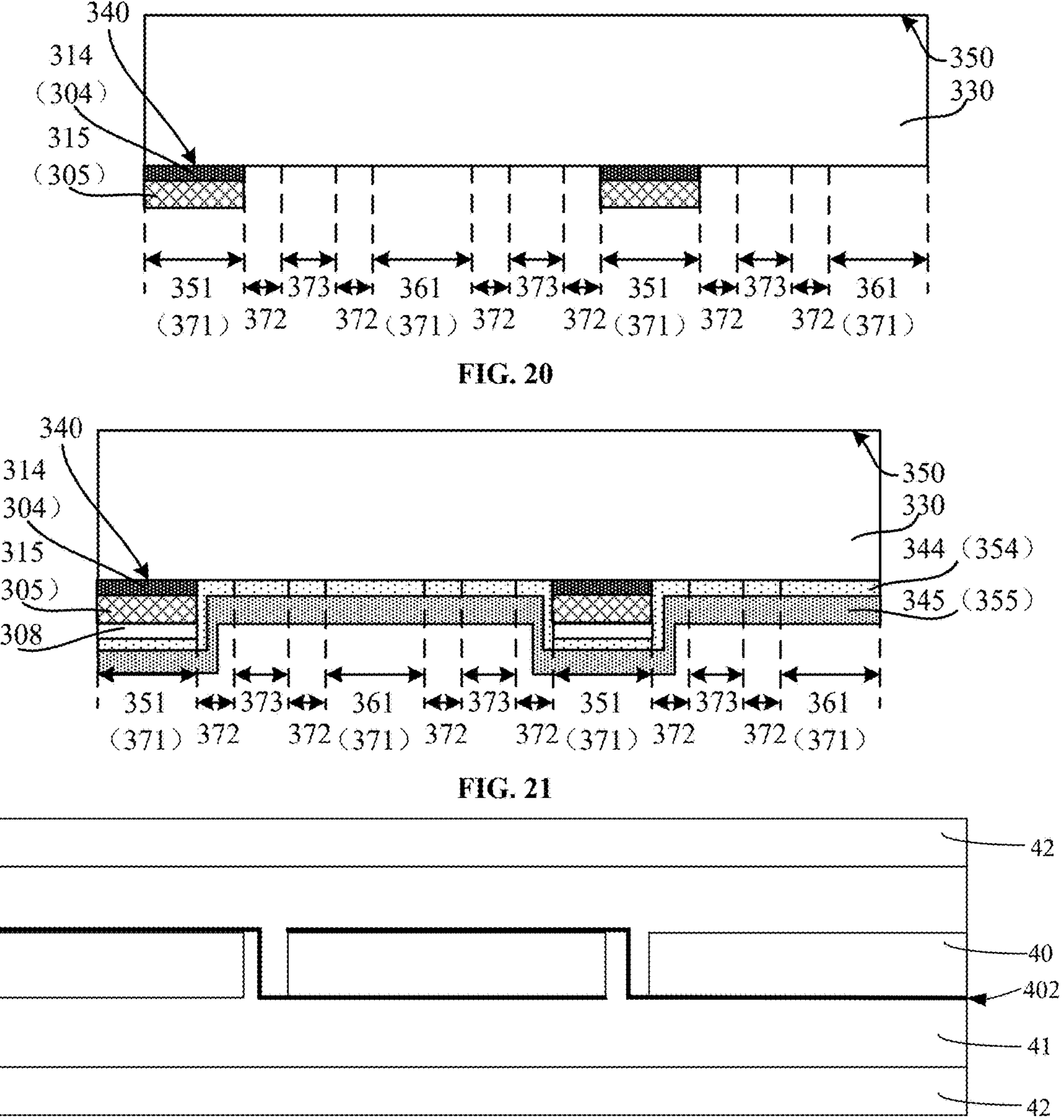
FIG. 22 is a schematic diagram illustrating the structure of a photovoltaic module according to yet another embodiment of the present disclosure.

In some embodiments, referring to FIGS. 19 to 21, the initial electrode region 371 includes an initial positive electrode region 351 and an initial negative electrode region 361. Referring to FIG. 12, the formed first dielectric layer 304 includes a first sub-dielectric portion 314 and a second sub-dielectric portion 324, where the first sub-dielectric portion 314 is formed over the positive electrode region 311, and the second sub-dielectric portion 324 is formed over the negative electrode region 321; and the formed first doped conductive layer 305 includes a first sub-doped conductive portion 315 and a second sub-doped conductive portion 325, the first sub-doped conductive portion 315 is disposed on a side of the first sub-dielectric portion 314 facing away from the positive electrode region 311, and the second sub-doped conductive portion 325 is disposed on a side of the second sub-dielectric portion 324 facing away from the negative electrode region 321, where a type of a doping element in the first sub-doped conductive portion 315 is different from a type of a doping element in the second sub doped conductive layer 325.

It should be noted that the initial substrate 330, the initial first surface 340, the initial second surface 350, the initial electrode region 371, the initial transition region 392, and the initial non-electrode region 393 in FIGS. 19 to 21 are all similar to the corresponding structures in the preceding embodiments, and details are not described herein again.

The operations of forming the first sub-dielectric portion 314 and the second sub-dielectric portion 324 are described in detail below.

In some embodiments, referring to FIG. 19, the operation of forming an initial first dielectric layer 354 includes: forming an initial first sub-dielectric portion 334 covering an initial first surface 340; and the operation of forming an initial first doped conductive layer 355 includes: forming an initial first sub-doped conductive portion 335 covering a surface of the initial first dielectric layer 354 facing away from the initial substrate 330.

With reference to FIGS. 19 and 20, the operation of performing a laser process includes: removing portions, formed over the initial negative electrode region 361, the initial transition region 372 and the initial non-electrode region 373, of the initial first sub-dielectric portion 334 and the initial first sub-doped conductive portion 335 by a first laser process, with the remaining portion of the initial first sub-dielectric portion 334 formed over the initial positive electrode region 351 being a first sub-dielectric portion 314, and the remaining portion of the initial first sub-doped conductive portion 335 formed over the initial positive electrode region 351 being a first sub-doped conductive portion 315.

In some embodiments, referring to FIG. 21, after forming the first sub-dielectric portion 314 and the first sub-doped conductive portion 315, forming the second sub-dielectric portion 324 (referring to FIG. 12) and the second sub-doped conductive portion 325 (referring to FIG. 12) may further include: forming a first mask layer 308, formed on a side of the first sub-doped conductive portion 315 facing away from the initial substrate 330.

With continued reference to FIG. 21, the operation of forming the initial first dielectric layer 354 may further include: forming an initial second sub-dielectric portion 344 covering the initial first surface 340 and the first mask layer 308; and the operation of forming the initial first doped conductive layer 355 may further include: forming an initial second sub-doped conductive portion 345 covering a surface of the initial second sub-dielectric portion 344 facing away from the initial substrate 330.

With reference to FIG. 21 and FIG. 12, the operation of performing a laser process further includes: removing portions, formed over the initial positive electrode region 351, the initial transition region 372 and the initial non-electrode region 373, of the initial second sub-dielectric portion 344 and the initial second sub-doped conductive portion 345 by a second laser process, with the remaining portion of the initial second sub-dielectric portion 344 formed over the initial negative electrode region 361 being a second sub-dielectric portion 324, and the remaining portion of the initial second sub-doped conductive portion 345 formed over the initial negative electrode region 361 being a second sub-doped conductive portion 325.

With reference to FIG. 21 and FIG. 12, the first mask layer 308 is removed.

It should be noted that the operations of forming the initial first dielectric layer 354 and the initial first doped conductive layer 355 in the operation of forming the IBC cell are different from the operations of forming the initial first dielectric layers 154, 254 and the initial first doped conductive layers 155, 255 in the preceding embodiments of forming the double-sided TOPCON cell and the HJT cell. In the operations of forming the IBC cell, the operation of forming the initial first dielectric layer 354 includes two separate sub-steps, i.e., forming the initial first sub-dielectric portion 334 and forming the initial second sub-dielectric portion 344; and the operation of forming the initial first doped conductive layer 355 includes two separate sub-steps, i.e., forming the initial first sub-doped conductive portion 335 and forming the initial second sub-doped conductive portion 345. The initial positive electrode region 351 and the initial negative electrode region 361 subjected to the first laser process and the second laser process become a positive electrode region 311 and a negative electrode region 321, respectively, where the electrode region 301 is a positive electrode region 311 or a negative electrode region 321; and the initial transition region 372 and the initial non-electrode region 373 subjected to the first laser process and the second laser process become a transition region 302 and a non-electrode region 303, respectively.

In summary, according to another embodiment of the present disclosure, the initial first dielectric layer 154 and the initial first doped conductive layer 155 are first formed over a entire surface, and then subjected to a laser process to form the transition region 102 having a first surface structure 112; and the first dielectric layer 104 and first doped conductive layer 105 stacked are formed over only the electrode region 101, which on the one hand, improves the problem of severe carrier recombination in the electrode region 101 through the passivation effect of the first dielectric layer 104 and the first doped conductive layer 105 on the electrode region 101, and on the other hand, avoids the first dielectric layer 104 and the first doped conductive layer 105 from reducing the absorption of the non-electrode region 103 and the transition region 102 for incident light irradiated to the first surface 110. Moreover, the first surface structure 112 facilitates improving the absorption rate of the first surface 110 for incident light.

Another embodiment of the present disclosure further provides a photovoltaic module. The photovoltaic module includes a plurality of solar cells in any of the preceding embodiments, and is configured to convert received light energy into electrical energy. FIG. 22 is a schematic diagram illustrating the structure of the photovoltaic module provided in yet another embodiment of the present disclosure. It should be noted that, for parts the same as or corresponding to those in the preceding embodiments, reference may be made to the corresponding description of the preceding embodiments, and details are not described herein again.

Referring to FIG. 22, the photovoltaic module includes: a battery string, formed by connecting a plurality of solar cells 40 according to any one of the preceding embodiments, or formed by connecting a plurality of solar cells 40 produced by using the method for preparing the solar cell according to any one of the preceding embodiments. The photovoltaic module further includes an encapsulation glue film 41 configured to cover a surface of the battery string, and a cover plate 42 configured to cover a surface of the encapsulation glue film 41 facing away the battery string. The solar cells 40 are electrically connected in a form of a whole slice or a plurality of slices to form a plurality of cell strings, and the plurality of cell strings are electrically connected in a series connection and/or parallel connection manner.

In some embodiments, the plurality of battery strings may be electrically connected to each other by a conductive band 402. FIG. 22 shows merely a position relationship of solar cells. That is, arrangement directions of electrodes with a same polarity of cells are the same or electrodes including a positive polarity of cells are arranged toward a same side, so that the conductive band respectively connects different sides of two adjacent cells. In some embodiments, the cells may alternatively be arranged according to a sequence that electrodes with different polarities face toward a same side, that is, electrodes of a plurality of adjacent cells are sequentially sorted according to a sequence of a first polarity, a second polarity, and the first polarity, and the conductive band connects two adjacent cells on a same side.

In some embodiments, no interval is provided between the cells, that is, the cells are overlapped with each other.

In some embodiments, the encapsulation glue film 41 includes a first encapsulation layer and a second encapsulation layer, where the first encapsulation layer covers one of a front surface and a back surface of the solar cell 40, and the second encapsulation layer covers the other of the front surface and the back surface of the solar cell 40. Specifically, at least one of the first encapsulation layer and the second encapsulation layer may be an organic encapsulation glue film such as a polyvinyl butyral (PVB) glue film, an ethylene-vinyl acetate copolymer (EVA) glue film, a polyolefin elastomer (POE) glue film, or a polyethylene glycol terephthalate (PET) glue film.

In some cases, a boundary exists between the first encapsulation layer and the second encapsulation layer before lamination, and after the photovoltaic module is formed through lamination processing, concepts of the first encapsulation layer and the second encapsulation layer do not exist, that is, the first encapsulation layer and the second encapsulation layer have formed the entire encapsulation glue film 41.

In some embodiments, the cover plate 42 may be a cover plate with a light-transmitting function such as a glass cover plate or a plastic cover plate. Specifically, a surface of the cover plate 42 facing the encapsulation glue film 41 may be an uneven surface, to increase the utilization of incident light. The cover plate 42 includes a first cover plate and a second cover plate. The first cover plate is opposite to the first encapsulation layer, and the second cover plate is opposite to the second encapsulation layer.

Those skilled in the art should appreciate that that the preceding implementations are specific embodiments for implementing the present disclosure, and in practice, various changes may be made in the form and details without departing from the spirit and scope of the embodiments of the present disclosure. Any person skilled in the art may make variations and modifications without departing from the spirit and scope of the embodiments of the present disclosure. Therefore, the protection scope of the embodiments of the present disclosure shall be defined by the appended claims.

What is claimed is:

1. A solar cell, comprising:

a substrate, having a first surface and a second surface opposite to the first surface, the first surface including alternating electrode regions and non-electrode regions, and transition regions, each respective transition region of the transition regions being abutted on one side by a respective electrode region of the electrode regions and on an opposing side by a respective non-electrode region of the non-electrode regions, wherein the respective transition region includes a plurality of spaced first pyramid structures and a plurality of micro-convex structures, and a one-dimensional size of a bottom of a respective micro-convex structure of the plurality of micro-convex structures is smaller than a one-dimensional size of a bottom of a respective first pyramid structure of the plurality of first pyramid structures; wherein the one-dimensional size of the bottom of the respective micro-convex structure or the respective first pyramid structure is one of a length or a diagonal length of the bottom of the respective micro-convex structure or the respective first pyramid structure, respectively, and wherein the plurality of spaced first pyramid structures are mixed with the plurality of micro-convex structures throughout the respective transition region;

a first dielectric layer, formed over the respective electrode region; and a first doped conductive layer, formed over the first dielectric layer.

2. The solar cell according to claim 1, wherein the plurality of micro-convex structures include at least one of prism structures inclined toward the respective electrode region, second pyramid structures or triangular plate-like structures.

3. The solar cell according to claim 2, wherein the prism structures are disposed on sidewalls of the plurality of first pyramid structures.

4. The solar cell according to claim 2, wherein a bottom of a respective second pyramid structure of the second pyramid structures is in a contact connection with a bottom of the respective first pyramid structure of the plurality of first pyramid structures.

5. The solar cell according to claim 2, wherein the triangular plate-like structures are disposed on sidewalls of the plurality of first pyramid structures.

6. The solar cell according to claim 1, wherein a material of the first doped conductive layer includes at least one of silicon carbide, amorphous silicon, microcrystalline silicon, or polycrystalline silicon.

7. The solar cell according to claim 1, wherein a surface of the first doped conductive layer formed over the respective electrode region has a second surface structure including a plurality of third pyramid structures; and the respective non-electrode region has a third surface structure including a plurality of fourth pyramid structures; and wherein the one-dimensional size of the bottom of the respective first pyramid structure is larger than a one-dimensional size of a bottom of a respective third pyramid structure of the plurality of third pyramid structures, and the one-dimensional size of the bottom of the respective third pyramid structure is larger than a one-dimensional size of a bottom of a respective fourth pyramid structure of the plurality of fourth pyramid structures.

8. The solar cell according to claim 1, wherein the electrode regions include positive electrode regions and negative electrode regions;

wherein the first dielectric layer includes first sub-dielectric portions and second sub-dielectric portions, each respective first sub-dielectric portion of the first sub-dielectric portions is formed over a respective positive electrode region of the positive electrode regions, and each respective second sub-dielectric portion of the second sub-dielectric portions is formed over a respective negative electrode region of the negative electrode regions; and wherein the first doped conductive layer includes first sub-doped conductive portions and second sub-doped conductive portions, a respective first sub-doped conductive portion of the first sub-doped conductive portions is disposed on a side of the respective first sub-dielectric portion facing away from the respective positive electrode region, a respective second sub-doped conductive portion of the second sub-doped conductive portions is disposed on a side of the respective second sub-dielectric portion facing away from the respective negative electrode region, and a type of a doping element in the respective first sub-doped conductive portion is different from a type of a doping element in the respective second sub-doped conductive portion.

9. The solar cell according to claim 8, wherein the respective electrode region has a fourth surface structure including a plurality of platform raised structures; and the respective non-electrode region has a fifth surface structure including a plurality of fifth pyramid structures;

wherein the one-dimensional size of the bottom of the respective first pyramid structure is greater than a one-dimensional size of a bottom of a respective fifth pyramid structure of the plurality of fifth pyramid structures.

10. The solar cell according to claim 1, wherein the respective electrode region has a first top surface, the respective non-electrode region has a second top surface, the first top surface is higher than the second top surface with the second surface as a reference, and a height difference between the first top surface and the second top surface is 0.5 μm to 10 μm.

11. The solar cell according to claim 2, wherein some of the prism structures are disposed proximate to the respective electrode region.

12. The solar cell according to claim 3, wherein some of the prism structures are disposed proximate to the respective electrode region.

13. The solar cell according to claim 2, wherein some of the prism structures are sequentially arranged in a direction away from sidewalls of the plurality of first pyramid structures.

14. The solar cell according to claim 3, wherein some of the prism structures are sequentially arranged in a direction away from sidewalls of the plurality of first pyramid structures.

15. The solar cell according to claim 11, wherein some of the prism structures are sequentially arranged in a direction away from sidewalls of the plurality of first pyramid structures.

16. The solar cell according to claim 2, wherein at least one second pyramid structure of the second pyramid structures is disposed in a spacing between two adjacent first pyramid structures of the plurality of first pyramid structures.

17. The solar cell according to claim 4, wherein at least one second pyramid structure of the second pyramid structures is disposed in a spacing between two adjacent first pyramid structures of the plurality of first pyramid structures.

18. The solar cell according to claim 2, wherein some of the triangular plate-like structures are sequentially arranged in a direction away from sidewalls of the plurality of first pyramid structures.

19. The solar cell according to claim 5, wherein some of the triangular plate-like structures are sequentially arranged in a direction away from sidewalls of the plurality of first pyramid structures.

20. A photovoltaic module, comprising:

at least one cell string, each formed by connecting a plurality of solar cells;

an encapsulation glue film, configured to cover a surface of the at least one cell string; and a cover plate, configured to cover a surface of the encapsulation glue film facing away from the at least one cell string;

wherein each of the plurality of solar cells comprises:

a substrate, having a first surface and a second surface opposite to the first surface, the first surface including alternating electrode regions and non-electrode regions, and transition regions, each respective transition region of the transition regions being abutted on one side by a respective electrode region of the electrode regions and on an opposing side by a respective non-electrode region of the non-electrode regions, wherein the respective transition region includes a plurality of spaced first pyramid structures and a plurality of micro-convex structures, and a one-dimensional size of a bottom of a respective micro-convex structure of the plurality of micro-convex structures is smaller than a one-dimensional size of a bottom of a respective first pyramid structure of the plurality of first pyramid structures; wherein the one-dimensional size of the bottom of the respective micro-convex structure or the respective first pyramid structure is one of a length or a diagonal length of the bottom of the respective micro-convex structure or the respective first pyramid structure, respectively, and wherein the plurality of spaced first pyramid structures are mixed with the plurality of micro-convex structures throughout the respective transition region;

a first dielectric layer, formed over the respective electrode region; and a first doped conductive layer, formed over the first dielectric layer.

* * * * *